(12) United States Patent
Moon et al.

(10) Patent No.: US 11,152,399 B2
(45) Date of Patent: Oct. 19, 2021

(54) WIRING SUBSTRATE AND DISPLAY DEVICE INCLUDING THE SAME WHICH SUPPRESS DETERIORATION OF THIN FILM TRANSISTOR

(71) Applicant: Samsung Display Co., Ltd., Yongin-si (KR)

(72) Inventors: Yeon Keon Moon, Hwaseong-si (KR); Kano Masataka, Hwaseong-si (KR); Myoung Hwa Kim, Seoul (KR); Jun Hyung Lim, Seoul (KR)

(73) Assignee: Samsung Display Co., Ltd., Yongin-si (KR)

(*) Notice: Subject to any disclaimer, the term of this patent is extended or adjusted under 35 U.S.C. 154(b) by 14 days.

(21) Appl. No.: 16/453,976

(22) Filed: Jun. 26, 2019

(65) Prior Publication Data
US 2020/0006387 A1    Jan. 2, 2020

(30) Foreign Application Priority Data

Jun. 28, 2018 (KR) .......................... 10-2018-0074948

(51) Int. Cl.
*H01L 27/12* (2006.01)
*H01L 29/786* (2006.01)
*G09G 3/36* (2006.01)

(52) U.S. Cl.
CPC ......... *H01L 27/124* (2013.01); *G09G 3/3696* (2013.01); *H01L 27/1218* (2013.01); *H01L 29/78618* (2013.01); *H01L 29/78696* (2013.01)

(58) Field of Classification Search
CPC ............. H01L 29/78696; H01L 27/124; H01L 29/78618; H01L 27/1218; H01L 29/7869;
(Continued)

(56) References Cited

U.S. PATENT DOCUMENTS 8,232,552 B2    7/2012 Yano et al.
9,012,910 B2 *  4/2015 Oda .................. H01L 29/78606
                                                    257/43
(Continued)

FOREIGN PATENT DOCUMENTS

JP         5828911       12/2015
KR      10-1201330       11/2012
(Continued)

*Primary Examiner* — Stephen M Bradley
(74) *Attorney, Agent, or Firm* — H.C. Park & Associates, PLC

(57) ABSTRACT

A display device in which a display area and a non-display area are defined, the display device including a wiring substrate, the wiring substrate including: a base substrate; a first thin film transistor disposed on the base substrate, located in the non-display area, and including a first gate pattern, a first semiconductor pattern disposed on the first gate pattern, a first source pattern disposed on the first semiconductor pattern, and a first drain pattern disposed on the first semiconductor pattern and spaced apart from the first source pattern; and a second thin film transistor disposed on the base substrate and located in the display area. A first channel width of the first thin film transistor is greater than a first overlap length of the first gate pattern, the first semiconductor pattern, and the first drain pattern.

18 Claims, 18 Drawing Sheets

(58) Field of Classification Search
CPC ........... H01L 27/1225; H01L 29/41733; H01L 27/1251; G09G 3/3696
See application file for complete search history.

(56) References Cited

U.S. PATENT DOCUMENTS

| | | | |
|---|---|---|---|
| 9,029,851 B2* | 5/2015 | Miyairi | ............... H01L 27/1259 257/43 |
| 9,830,845 B2 | 11/2017 | Lim et al. | |
| 10,186,525 B2 | 1/2019 | Saito et al. | |
| 2005/0258427 A1* | 11/2005 | Chan | ................. H01L 29/66787 257/72 |
| 2017/0256620 A1* | 9/2017 | Lin | ................... H01L 29/78666 |

FOREIGN PATENT DOCUMENTS

| | | |
|---|---|---|
| KR | 10-2016-0088469 | 7/2016 |
| WO | 2008/117810 | 10/2008 |
| WO | 2012/008192 | 1/2012 |

\* cited by examiner

WIRING SUBSTRATE AND DISPLAY DEVICE INCLUDING THE SAME WHICH SUPPRESS DETERIORATION OF THIN FILM TRANSISTOR

CROSS REFERENCE TO RELATED APPLICATION

This application claims priority from and the benefit of Korean Patent Application No. 10-2018-0074948, filed on Jun. 28, 2018, which is hereby incorporated by reference for all purposes as if fully set forth herein.

BACKGROUND

Field

Exemplary embodiments of the invention relate generally to a wiring substrate and a display device including the wiring substrate.

Discussion of the Background

The importance of a display device has increased with the development of multimedia. Accordingly, various types of display devices, such as a liquid crystal display (LCD), an organic light emitting diode display (OLED) and the like have been developed.

One of the driving methods of the liquid crystal display device or the organic light emitting display device is an active matrix driving method. The active matrix driving method has an advantage in that each pixel can be driven individually, as compared with a passive matrix driving method in which all the pixels in one row or one column are driven at the same time. Further, the active matrix driving method provides a uniform driving signal according to the position of a pixel to improve the display quality of a display device.

For example, the active matrix driving method can be implemented by disposing one or more thin film transistors, that is, individual driving elements such as pixel transistors, for each pixel. The control terminal of the pixel transistor disposed for each pixel may receive a signal from a scan driver through a scan line, and the input terminal of the pixel transistor may receive a signal from a data driver through a data line.

The scan driver may include a plurality of thin film transistors. Recently, as display devices have become larger, an increase in a source-drain voltage (VSD) applied to the thin film transistor of the scan driver is required. However, when a high source-drain voltage is applied to the thin film transistor, the operational characteristics of the thin film transistor may deteriorate, which may affect the durability and reliability of a display device.

The above information disclosed in this Background section is only for understanding of the background of the inventive concepts, and, therefore, it may contain information that does not constitute prior art.

SUMMARY

Exemplary embodiments of the present invention provide a display device capable of suppressing the deterioration of a thin film transistor.

Exemplary embodiments of the present invention also provide a wiring substrate capable of suppressing the deterioration of a thin film transistor.

Additional features of the invention will be set forth in the description which follows, and in part will be apparent from the description, or may be learned by practice of the invention.

An exemplary embodiment of the invention provides a display device, in which a display area and a non-display area are defined, the display device including a wiring substrate, the wiring substrate including: a base substrate; a first thin film transistor disposed on the base substrate, located in the non-display area, and including a first gate pattern, a first semiconductor pattern disposed on the first gate pattern, a first source pattern disposed on the first semiconductor pattern, and a first drain pattern disposed on the first semiconductor pattern and spaced apart from the first source pattern; and a second thin film transistor disposed on the base substrate and located in the display area. A first channel width of the first thin film transistor is greater than a first overlap length of the first gate pattern, the first semiconductor pattern, and the first drain pattern.

Another exemplary embodiment of the invention provides a wiring substrate including a base substrate; a first thin film transistor disposed on the base substrate and including a first gate pattern, a first semiconductor pattern disposed on the first gate pattern, a first source pattern disposed on the first semiconductor pattern, and a first drain pattern disposed on the first semiconductor pattern and spaced apart from the first source pattern; and a second thin film transistor disposed on the base substrate. A first channel width of the first thin film transistor is greater than a first overlap length of the first gate pattern, the first semiconductor pattern, and the first drain pattern.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
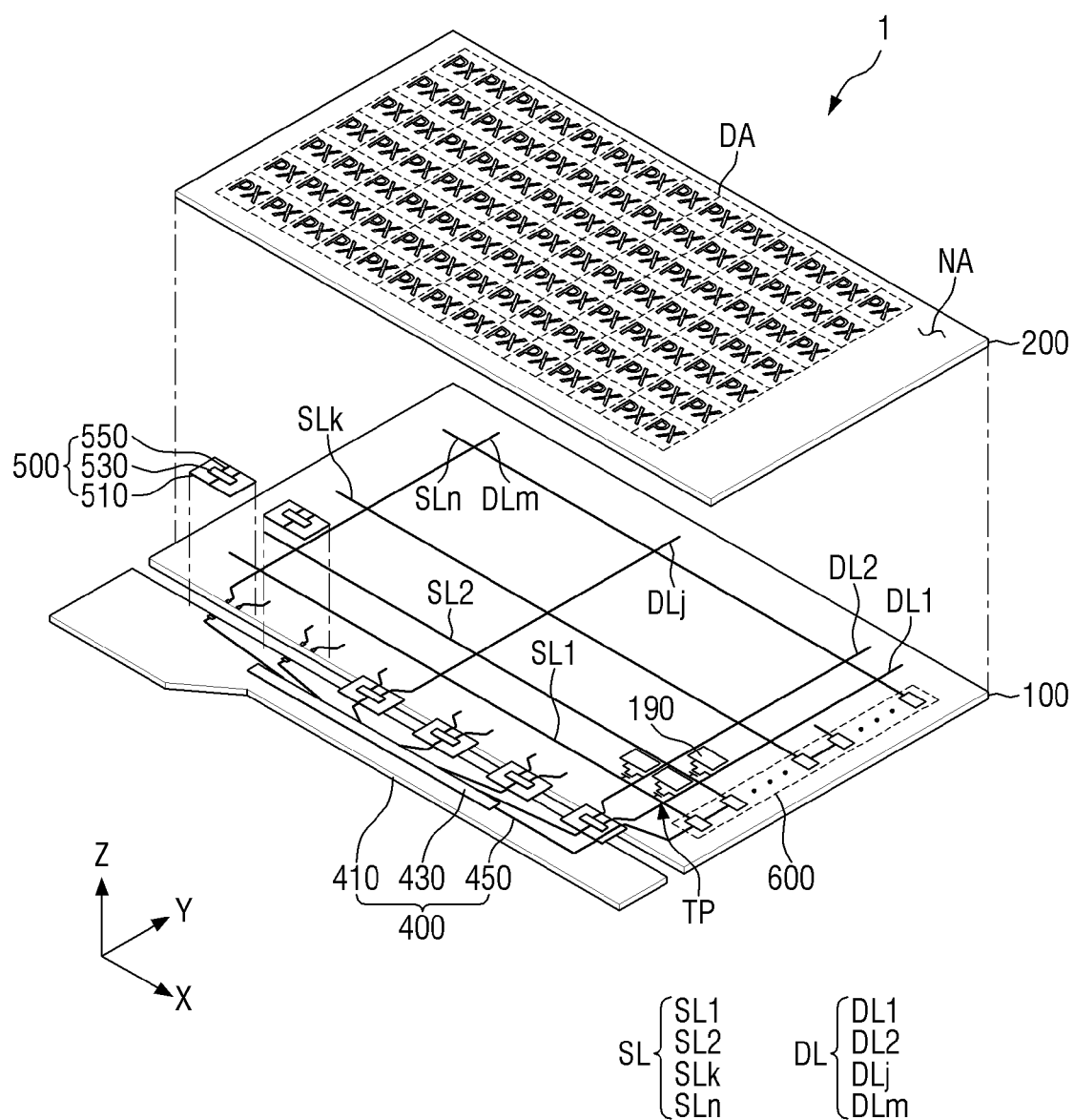
FIG. 1 is an exploded perspective view of a display device according to an exemplary embodiment of the present invention.

In the following description, for the purposes of explanation, numerous specific details are set forth in order to provide a thorough understanding of various exemplary embodiments of the invention. As used herein "embodiments" are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

In this specification, the first direction X refers to any direction in the plane, and the second direction Y refers to another direction crossing the first direction X in the plane. Further, the third direction Z refers to a direction perpendicular to the plane.

Unless defined otherwise, the "plane" refers to a plane to which the first direction X and the second direction Y belong. Further, unless defined otherwise, the term "overlapping" refers to overlapping in the third direction Z in the plan view.

Hereinafter, exemplary embodiments of the present invention will be described with reference to the attached drawings.

Figure 2:
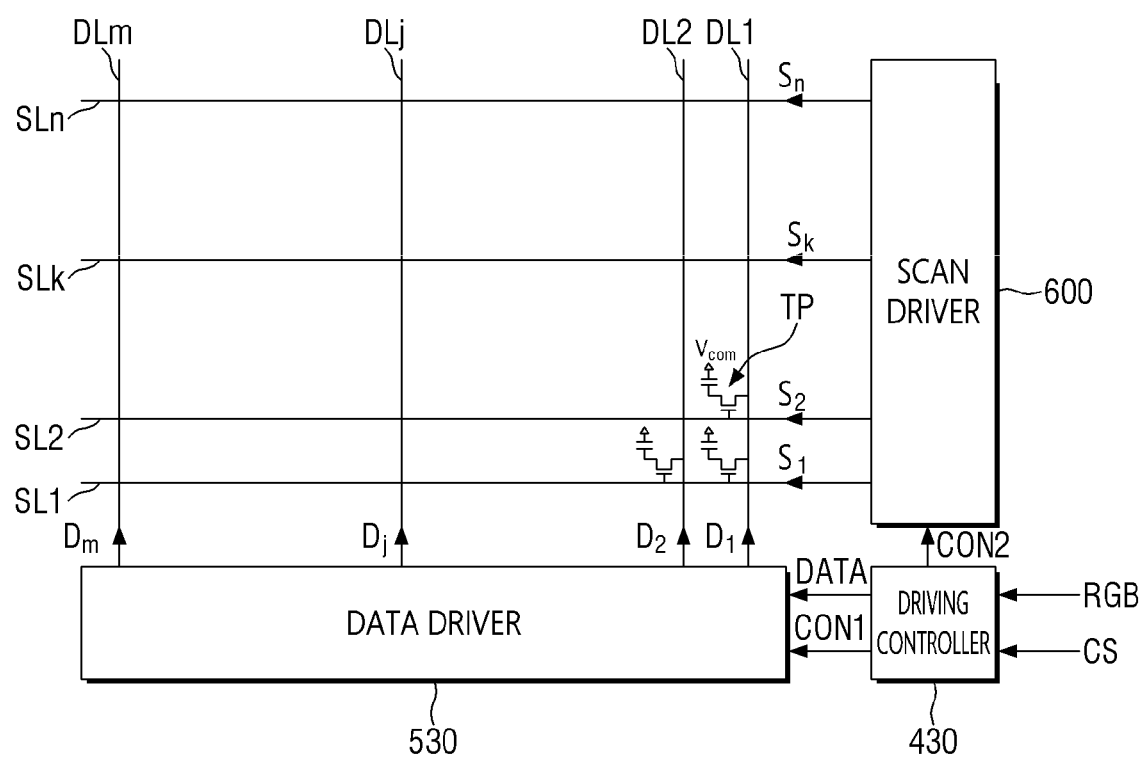
FIG. 2 is a block diagram of the display device of FIG. 1.

FIG. 1 is an exploded perspective view of a display device 1 according to an embodiment of the present invention. FIG. 2 is a block diagram of the display device 1 of FIG. 1.

Referring to FIGS. 1 and 2, the display device 1 according to an exemplary embodiment includes a wiring substrate (e.g., a first substrate) 100 and a counter substrate (e.g., a second substrate) 200 disposed on the wiring substrate 100, and may further include a printed circuit board 400 and a flexible circuit film 500.

A display area DA and a non-display area NA can be defined in the display device 1. The display area DA includes a plurality of pixels PX and contributes to substantial image display. In this specification, the term "pixel" refers to a single area into which the display device 1 or the display area DA is partitioned for color display in a plan view to be recognized by a viewer, and one pixel may express one predetermined basic color. Examples of the basic color may include, but are not limited to, red, green and blue. In a plan view, the display area DA may be surrounded by the non-display area NA. The non-display area NA refers to an area not contributing to image display.

The wiring substrate 100 includes pixel transistors TP and a pixel electrode 190, which are disposed in the display area DA, and may further include scan lines SL transmitting control signals to the pixel transistors TP, a scan driver 600, and data lines transmitting data signals to the pixel transistors TP.

The scan lines SL may extend in the first direction X to electrically connect the scan driver 600 and the pixel transistors TP. Further, the scan lines SL may include a first scan line SL1, a second scan line SL2, a k-th scan line SLk, and an n-th scan line SLn (k is an integer of 2 or more, and n is an integer greater than k). For example, the plurality of pixel transistors TP repeatedly arranged in the first direction X may share any scan line. The first direction X and the second direction Y may be perpendicular to each other, but the inventive concepts are not limited thereto.

The data lines DL may extend in the second direction Y to electrically connect the data driver 530 and the pixel transistors TP. Further, the data lines DL may include a first data line DL1 spaced in the first direction X, a second data line DL2, a j-th data line DLj, and a m-th data line DLm (j is an integer of 2 or more, and m is an integer greater than j). For example, the plurality of pixel transistors TP repeatedly arranged in the second direction Y may share any data line.

A scan driver 600 and a sealing member (not shown) for coupling the wiring substrate 100 and the counter substrate 200 may be disposed in the non-display area NA. Further, a driving controller 430 may be mounted on the printed circuit board 400 to be connected to the flexible circuit film 500, and the data driver 530 may be mounted on the flexible circuit film 500 to be connected to the wiring substrate 100. For convenience of explanation, although FIG. 1 shows a state where the flexible circuit film 500 is unfolded without being bent, the flexible circuit film 500 of the display device 1 may be bent toward the back surface of the wiring substrate 100, and the printed circuit board 400 may be disposed on the back surface of the wiring substrate 100.

The printed circuit board 400 may include a base 410 and a driving controller 430 disposed on the base 410. The base 410 may have insulating properties. Further, the base 410 may be rigid or flexible.

In an exemplary embodiment, the driving controller 430 may include at least one of a data controller (not shown), a scan controller (not shown), and a timing controller (not shown). The driving controller 430 may receive an image signal RGB and control signals CS, such as a vertical synchronization signal Vsync, a horizontal synchronization signal Hsync, a clock signal CLK, and a data enable signal DE from an external graphic controller. Further, the driving controller 430 may generate image data DATA, a data control signal CON1, and a scan control signal CON2 according to a signal provided from the graphic controller. The driving controller 430 may be electrically connected to an external graphic controller (not shown), the data driver 530, and the scan driver 600 through the first conductive pattern 450 of the printed circuit board 400.

The flexible circuit film 500 may include a base 510 and a data driver 530 disposed on the base 510. The base 510 may have insulating properties and flexibility. As a non-limiting example, the flexible circuit film 500 may be a chip-on-film package.

In an exemplary embodiment, the data driver 530 may include a data IC. The data driver 530 may generate data signals D1, D2, Dj, and Dm according to the image data DATA and the data control signal CON1 provided from the driving controller 430, and may provide these data signals to the plurality of data lines DL. The data driver 530 may be electrically connected to the driving controller 430 and the data lines DL through the second conductive pattern 550 of the flexible circuit film 500.

The scan driver 600 may be mounted on the wiring substrate 100. The scan driver 600 may generate scan signals $S_1$, $S_2$, $S_k$, and $S_n$ according to the scan control signal CON2 provided from the drive controller 430 and may provide these scan signals to the plurality of scan lines SL.

Figure 3:
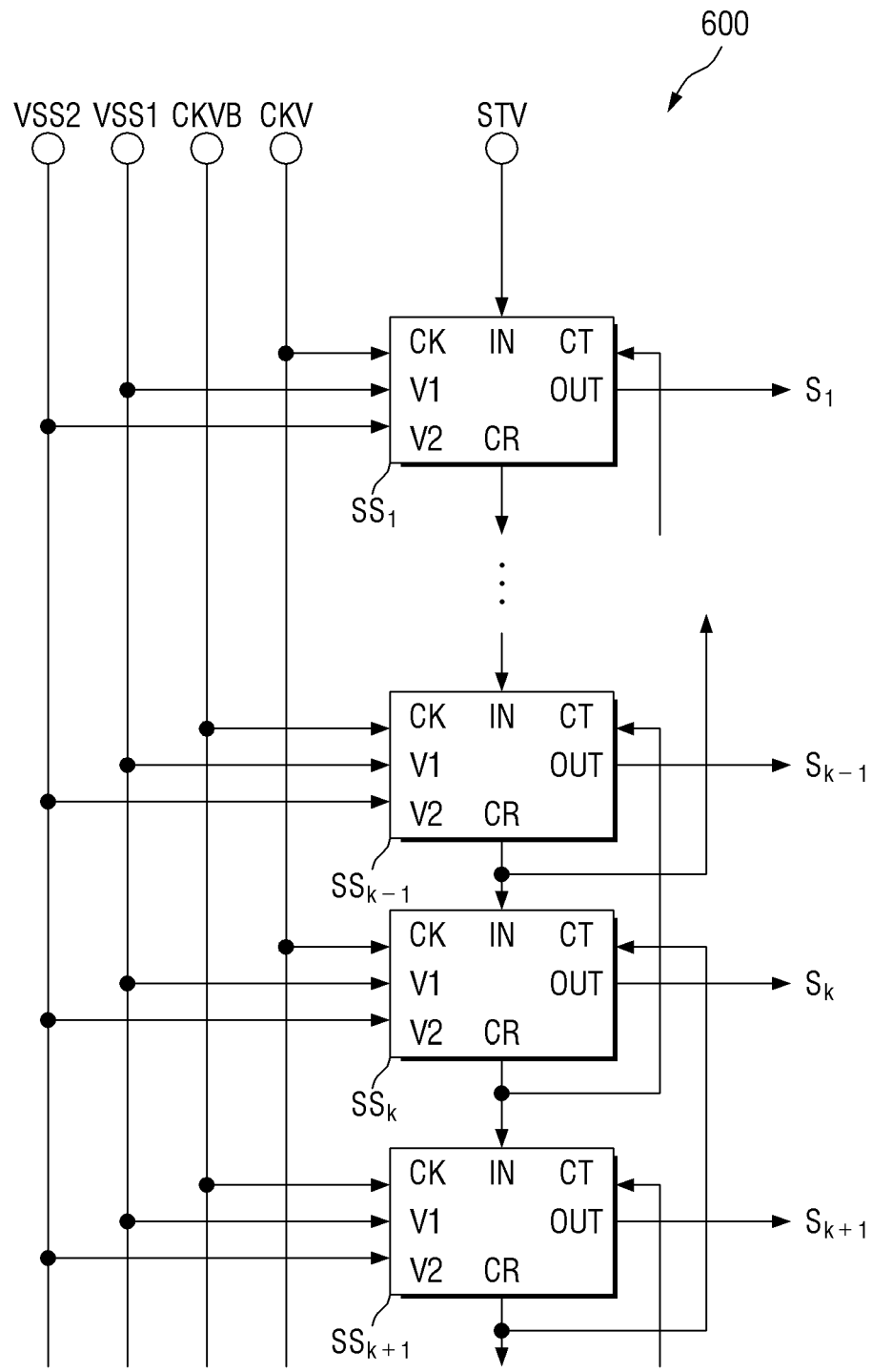
FIG. 3 is a block diagram of the scan driver of FIG. 2.
Figure 4:
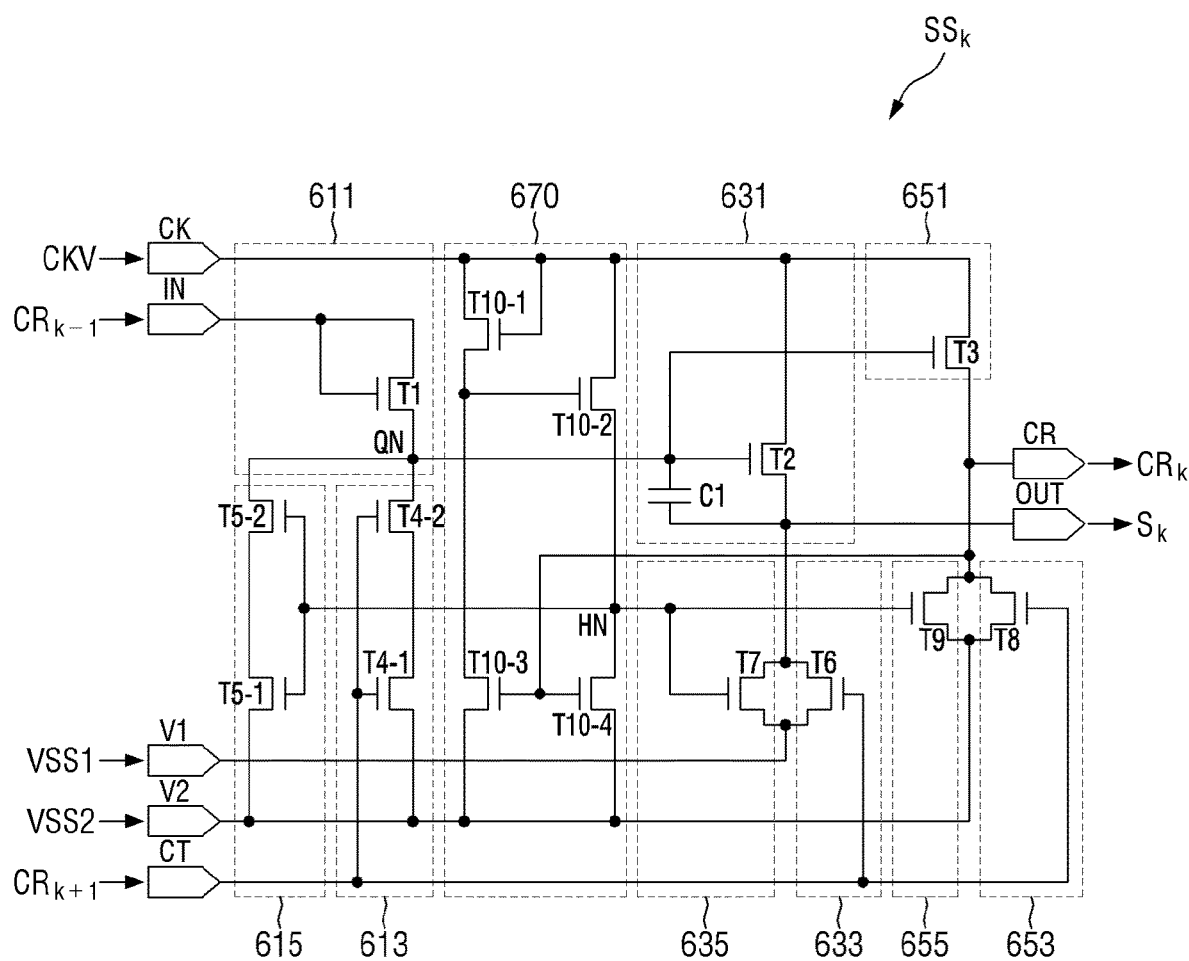
FIG. 4 is an equivalent circuit diagram of the scan driving stage of FIG. 3.
Figure 5:
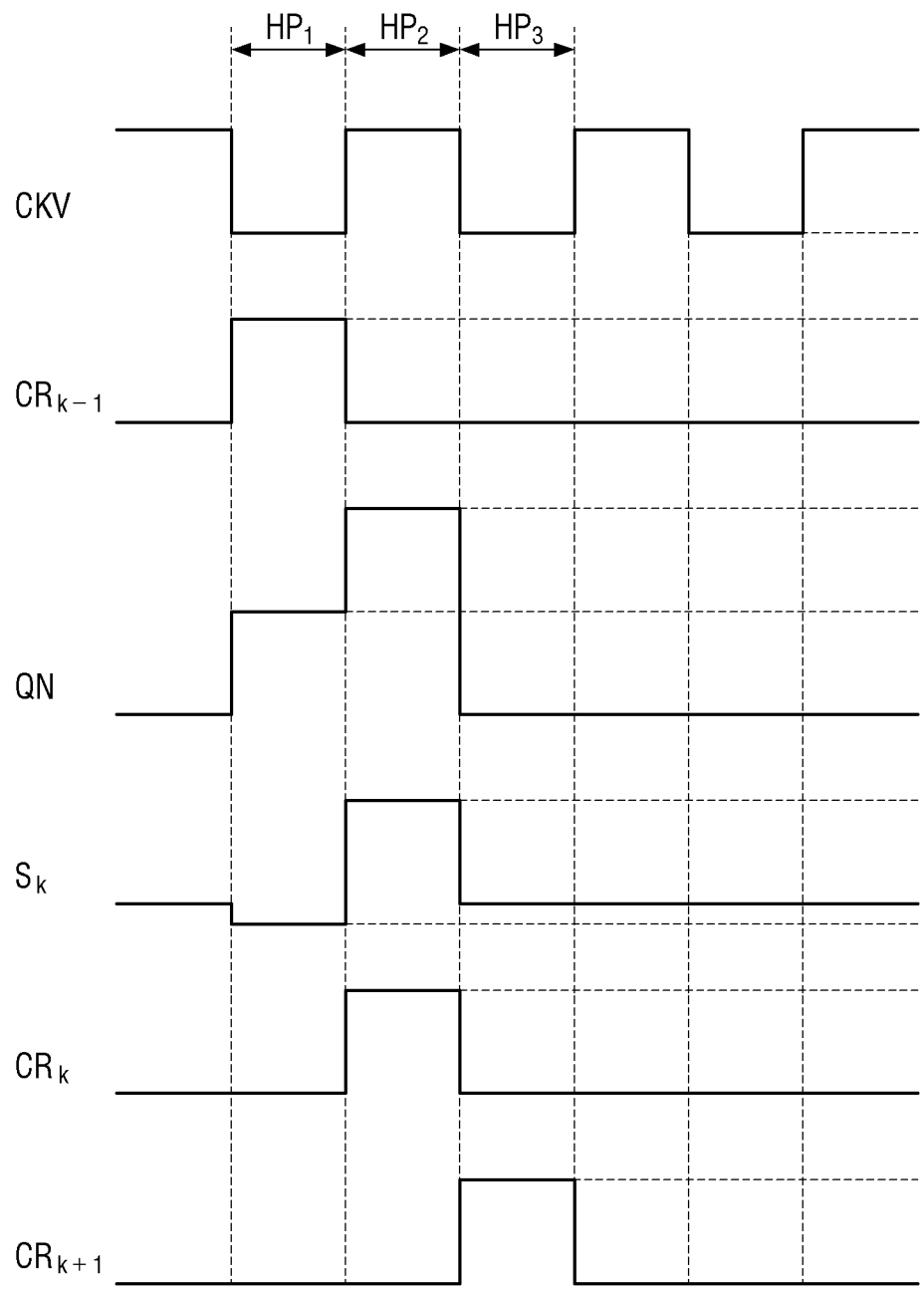
FIG. 5 is a signal waveform diagram applied to the scan driving stage of FIG. 4.

Hereinafter, the scan driver 600 will be described in more detail with reference to FIGS. 3 to 5. FIG. 3 is a block diagram of the scan driver 600 of FIG. 2. FIG. 4 is an equivalent circuit diagram of the scan driving stage $SS_k$ of FIG. 3. FIG. 5 is a signal waveform diagram applied to the scan driving stage $SS_k$ of FIG. 4.

Referring to FIGS. 3 to 5, the scan driver 600 may include a plurality of scan driving stages $SS_1$, $SS_{k-1}$, $SS_k$, and $SS_{k+1}$. The respective scan driving stages $SS_1$, $SS_{k-1}$, $SS_k$, and $SS_{k+1}$ may be connected to each other in a dependent manner. For example, any scan driving stage (e.g., k-th driving stage $SS_k$) may receive a carry signal $CR_{k-1}$ of the previous scan driving stage (e.g., k–1-th driving stage $SS_{k-1}$), and start to be driven by the carry signal $CR_{k-1}$. That is, the plurality of scan driving stages $SS_1$, $SS_{k-1}$, $SS_k$, and $SS_{k+1}$ may be sequentially driven by the scan driver start signal STV and the carry signal transmitted from the previous scan drive stage to the next scan drive stage.

The respective scan driving stages $SS_1$, $SS_{k-1}$, $SS_k$, and $SS_{k+1}$ may provide scan signals $S_1$, $S_{k-1}$, $S_k$, and $S_{k+1}$ to the corresponding scan lines SL. For example, the first scan driving stage SS1 may provide the scan signal $S_1$ to the first scan line SL1. The k–1-th scan driving stage $SS_{k-1}$ may provide the scan signal $S_{k-1}$ to the k–1-th scan line during a specific horizontal period $HP_1$ (hereinafter, referred to as a first horizontal period), the k-th scan driving stage $SS_k$ may provide the scan signal $S_k$ to the k-th scan line during the next horizontal period $HP_2$ (hereinafter, referred to as a second horizontal period), and the k+1-th scan driving stage $SS_{k+1}$ may provide the scan signal $S_{k+1}$ to the k+1-th scan line during the next horizontal period $HP_3$ (hereinafter, referred to as a third horizontal period). Hereinafter, the k-th scan driving stage $SS_k$ will be described as an example.

The k-th scan driving stage $SS_K$ may include an input unit including an input terminal IN, a clock terminal CK, a control terminal CT, a first voltage terminal V1, and a second voltage terminal V2, and an output unit including an output terminal OUT and a carry terminal CR.

A signal for starting the driving of the scan driving stage $SS_K$ may be input to the input terminal IN. For example, the input terminal IN may receive a carry signal $CR_{k-1}$ of the previous scan driving stage (that is, k–1-th scan driving stage $SS_{K-1}$). When there is no previous scan drive stage, the first scan driving stage $SS_1$ may receive the scan driver start signal STV.

The control terminal CT may receive a carry signal $CR_{k+1}$ of the next scan driving stage (that is, k+1-th scan driving stage $SS_{K+1}$). The carry signal $CR_{k+1}$ provided from the next scan driving stage may allow a signal input to the scan driving stage $SS_K$ and/or a signal output from the scan driving stage $SS_k$ to be pulled down.

The clock terminal CK may receive any one of a first clock signal CKV and a second clock signal CKVB.

The first clock signal CKV may be a square wave signal repeating a high level and a low level. The second clock signal CKVB may be an inverted signal of the first clock signal CKV. For example, the first clock signal CKV may be input to the odd scan driving stages, and the second clock signal CKVB may be input to the even scan driving stages. In an exemplary embodiment where the k-th scan driving stage $SS_k$ is an odd scan driving stage, the first clock signal CKV may be applied to the scan driving stage $SS_K$. In another exemplary embodiment where the k-th scan driving stage $SS_k$ is an even scan driving stage, the second clock signal CKVB may be applied to the scan driving stage $SS_k$.

The first voltage terminal V1 and the second voltage terminal V2 may receive a first driving voltage VSS1 and a second driving voltage VSS2, respectively. Each of the first driving voltage VSS1 and the second driving voltage VSS2 may be a direct current voltage. The second driving voltage VSS2 may be a voltage having a lower level than the first driving voltage VSS1. The first driving voltage VSS1 and the second driving voltage VSS2 may be applied to the respective scan driving stages $SS_1$, $SS_{k-1}$, $SS_k$, and $SS_{k+1}$.

The output terminal OUT may be electrically connected to the scan line SLk to output the scan signal $S_k$. The scan signal $S_k$ outputted through the output terminal OUT of the scan driving stage $SS_k$ may be a control signal of the pixel transistor TP in the display area DA to be described later. That is, the scan signal $S_K$ is provided to a gate pattern GEP of the pixel transistor TP, and on/off of the pixel transistor TP may be controlled according to the scan signal $S_k$.

The carry terminal CR may output a signal for starting the driving of the next scan driving stage (that is, k+1-th scan driving stage $SS_{k+1}$). For example, the carry terminal CR may provide a carry signal $CR_k$ to the next scan driving stage $SS_{k+1}$. The respective scan driving stages $SS_1$, $SS_kL1$, $SS_k$, and $SS_{k+1}$ may be connected depending on the carry signals $CR_1$, $CR_{k-1}$, $CR_k$, and $CR_{k+1}$. Further, the carry terminal CR may provide the carry signal $CR_k$ to the control terminal CT of the previous scan driving stage (that is, k–1-th scan driving stage $SS_{k-1}$).

In an exemplary embodiment, the k-th scan driving stage $SS_k$ includes a control unit 611, a scan signal output unit 631, and a carry signal output unit 651, and may further include a scan signal pull down unit 633, a carry signal pull down unit 653, a control signal holding unit 615, a scan signal holding unit 635, a carry signal holding unit 655, and a holding control unit 670.

The control unit 611 may transmit the carry signal $CR_{k-1}$ to a control node QN in response to the carry signal $CR_{k-1}$ of the previous scan driving stage $SS_{k-1}$ applied during the first horizontal period $HP_1$. For example, the control unit 611 may include a control transistor T1 (e.g., a first thin film transistor). The gate and source of the control transistor T1 may be electrically connected to the input terminal IN, respectively, and the drain thereof may be electrically connected to the control node QN. The carry signal $CR_{k-1}$ of the previous scan driving stage $SS_{k-1}$ may be a signal having a high level only during the first horizontal period $HP_1$. The control transistor T1 may transmit the carry signal $CR_{k-1}$ of the first horizontal period $HP_1$ to the drain. Therefore, the control node QN may be charged with a high level in the first horizontal period $HP_1$.

The scan signal output unit 631 may provide a scan signal $S_k$ to the scan line SLk. For example, the scan signal output section 631 may include a charge capacitor C1 and a scan signal output transistor T2.

The first capacitor electrode CP1 of the charge capacitor C1 may be electrically connected to the control node QN, and the second capacitor electrode CP2 may be electrically connected to the output terminal OUT. The charge capacitor C1 may maintain a voltage charged in the control node QN up to the second horizontal period $HP_2$. That is, the charge capacitor C1 may maintain the scan signal output transistor T2 and the carry signal output transistor T3 in the ON state in the second horizontal period $HP_2$.

The gate of the scan signal output transistor T2 may be electrically connected to the control node QN, the source thereof may be electrically connected to the clock terminal CK, and the drain thereof may be electrically connected to the output terminal OUT. The first clock signal CKV may be a square wave signal having a low level in the first horizontal period $HP_1$ and the third horizontal period $HP_3$ and having a high level in the second horizontal period $HP_2$. The scan signal output transistor T2 may transmit the first clock signal CKV in the second horizontal period $HP_2$ to the drain. Therefore, a high level voltage may be provided to the output terminal OUT and the scan line SLk in the second horizontal period $HP_2$.

The carry signal output unit 651 may provide the carry signal $CR_k$ to the carry terminal CR. For example, the carry signal output section 651 may include a carry signal output transistor T3. The gate of the carry signal output transistor T3 may be electrically connected to the control node QN, the source thereof may be electrically connected to the clock terminal CK, and the drain thereof may be electrically connected to the carry terminal CR. The carry signal output transistor T3 may transmit the clock signal CKV in the second horizontal period $HP_2$ to the drain. Therefore, a high level voltage may be provided to the carry terminal CR in the second horizontal period $HP_2$. For example, the carry signal $CR_k$ output from the scan driving stage $SS_k$ may be a signal having a high level only during the second horizontal period $HP_2$.

The control signal pull down unit 613 may pull down the voltage of the control node QN in response to the carry signal $CR_{k+1}$ of the next scan driving stage $SS_{k+1}$ applied to the third horizontal unit $HP_3$. That is, the control signal pull down unit 613 may allow the control node QN to have a low level in the third horizontal period $HP_3$. For example, the control signal pull down unit 613 may include a first control signal pull down transistor T4-1 and a second control signal pull down transistor T4-2, which are connected in series. The gates of the first control signal pull down transistor T4-1 and the second control signal pull down transistor T4-2 may be electrically connected to the control terminal CT, respectively. The source of the first control signal pull down transistor T4-1 may be electrically connected to the second voltage terminal V2, and the drain of the first control signal pull down transistor T4-1 may be electrically connected to the source of the second control signal pull down transistor T4-2. The drain of the second control signal pull down transistor T4-2 may be electrically connected to the control node QN. The carry signal $CR_{k+1}$ of the next scan driving stage $SS_{k+1}$ may be a signal having a high level only during the third horizontal period $HP_3$.

The control signal holding unit 615 may allow the pulled-down control node QN to maintain a low level. For example, the control signal holding unit 615 may allow the control node QN to maintain a low level in the third horizontal period $HP_3$ and subsequent horizontal periods regardless of the voltage level of the first clock signal CKV having a square wave signal. The control signal holding unit 615 may include a first control signal holding transistor T5-1 and a second control signal holding transistor T5-2, which are connected in series. The gates of the first control signal holding transistor T5-1 and the second control signal holding transistor T5-2 may be electrically connected to a holding control node HN, respectively. The source of the first control signal holding transistor T5-1 may be electrically connected to the second voltage terminal V2, and the drain thereof may be electrically connected to the source of the second control signal holding transistor T5-2. The drain of the second control signal holding transistor T5-2 may be electrically connected to the control node QN.

The scan signal pull down unit 633 may pull down the voltage of the output terminal OUT in response to the carry signal $CR_{k+1}$ of the next scan driving stage applied to the third horizontal period $HP_3$. That is, the scan signal pull down unit 633 may allow the output terminal OUT to have a low level in the third horizontal period $HP_3$. For example, the scan signal pull down unit 633 may include a scan signal pull down transistor T6. The gate of the scan signal pull down transistor T6 may be electrically connected to the control terminal CT, the source thereof may be electrically connected to the first voltage terminal V1, and the drain thereof may be electrically connected to the output terminal OUT.

The scan signal holding unit 635 may allow the pulled-down output terminal OUT to maintain a low level. For example, the scan signal holding unit 635 may allow the output terminal OUT to maintain a low level in the third horizontal period $HP_3$ and subsequent horizontal periods regardless of the voltage level of the first clock signal CKV having a square wave signal. The scan signal holding unit 635 may include a scan signal holding transistor T7. The source of the scan signal holding transistor T7 may be electrically connected to the first voltage terminal V1, and the drain thereof may be electrically connected to the output terminal OUT.

The carry signal pull down unit 653 may pull down the voltage of the carry terminal CR in response to the carry signal $CR_{k+1}$ applied to the third horizontal period $HP_3$. That is, the carry signal pull down unit 653 may allow the carry terminal CR to have a low level in the third horizontal period $HP_3$. For example, the carry signal pull down unit 653 may include a carry signal pull down transistor T8. The gate of the carry signal pull down transistor T8 may be electrically connected to the control terminal CT, the source thereof may be electrically connected to the second voltage terminal V2, and the drain thereof may be electrically connected to the carry terminal CR.

The carry signal holding unit 655 may allow the pulled-down carry terminal CR to maintain a low level. For example, the carry signal holding unit 655 may allow the carry terminal CR to maintain a low level in the third horizontal period $HP_3$ and subsequent horizontal periods regardless of the voltage level of the first clock signal CKV having a square wave signal. The carry signal holding unit 655 may include a carry signal holding transistor T9. The source of the carry signal holding transistor T9 may be electrically connected to the second voltage terminal V2, and the drain thereof may be electrically connected to the carry terminal CR.

The holding control unit 670 may control the control signal holding unit 615, the scan signal holding unit 635, and the carry signal holding unit 655. The holding control unit 670 may transmit a signal to the holding control node HN according to the first clock signal CKV applied to the clock terminal CK and the second driving voltage VSS2 applied to the second voltage terminal V2. For example, the holding control unit 670 may include a first holding transistor T10-1, a second holding transistor T10-2, a third holding transistor T10-3, and a fourth holding transistor T10-4.

The gate and source of the first holding transistor T10-1 may be electrically connected to the clock terminal CK, and the drain thereof may be electrically connected to the gate of the second holding transistor T10-2 and the drain of the third holding transistor T10-3. The source of the second holding transistor T10-2 may be electrically connected to the clock terminal CK, and the drain thereof may be electrically connected to the holding control node HN. The gate of the third holding transistor T10-3 may be electrically connected to the gate of the fourth holding transistor T10-4 and the output terminal OUT, and the source thereof may be electrically connected to the second voltage terminal V2. The source of the fourth holding transistor T10-4 may be electrically connected to the second voltage terminal V2, and the drain thereof may be electrically connected to the holding control node HN. The holding control node HN may be connected to the gates of the first control signal holding transistor T5-1, the second control signal holding transistor T5-2, the scan signal holding transistor T7, and the carry signal holding transistor T9.

Figure 6:
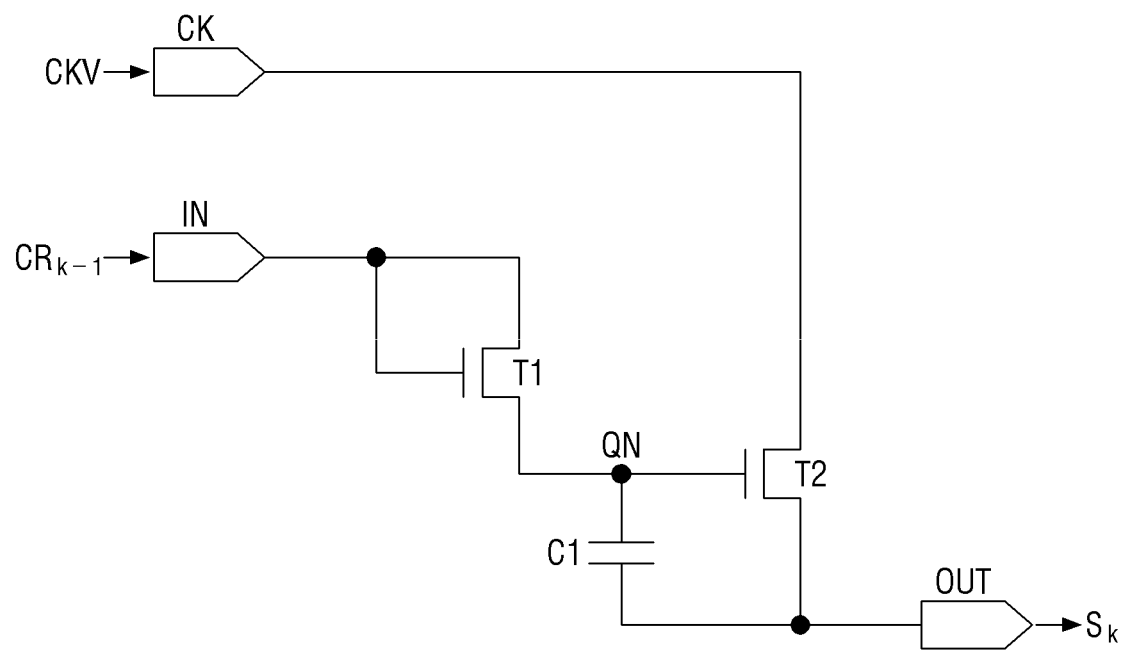
FIG. 6 is an equivalent circuit diagram of the control transistor and the scan signal output transistor of FIG. 4.
Figure 7:
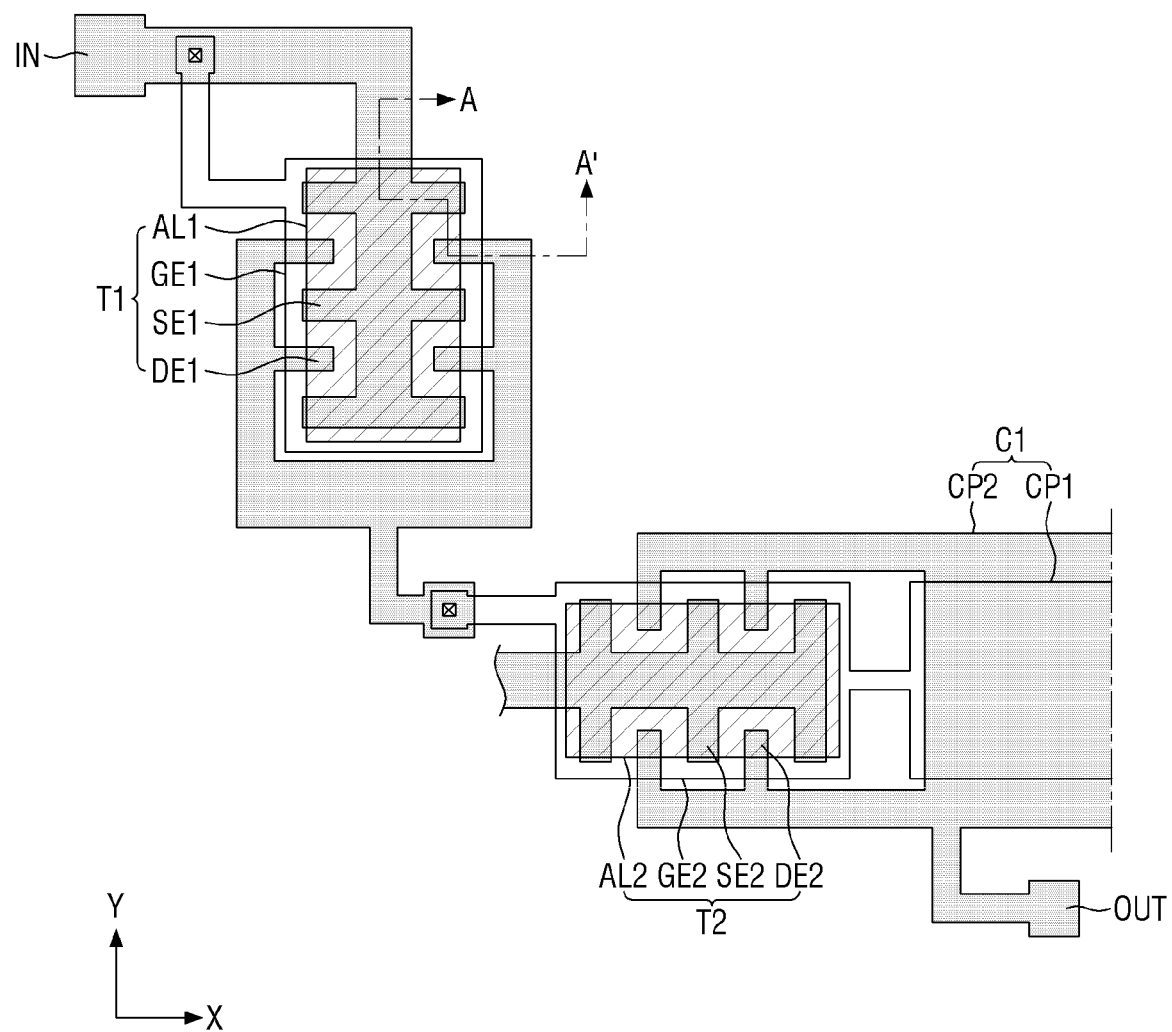
FIG. 7 is a layout view of the control transistor and the scan signal output transistor of FIG. 4.

Hereinafter, the control transistor T1 will be described in more detail with reference to FIGS. 6 and 7. FIG. 6 is an equivalent circuit diagram of the control transistor T1 and the scan signal output transistor T2 of FIG. 4. FIG. 7 is a layout view of the control transistor T1 and the scan signal output transistor T2 of FIG. 4.

Referring to FIGS. 6 and 7, the control transistor T1 may include a control gate pattern GE1 (e.g., a first gate pattern), a control source pattern SE1 (e.g., a first source pattern), a control drain pattern DE1 (e.g., a first drain pattern), and a control semiconductor pattern AL1 (e.g., a first semiconductor pattern). The scan signal output transistor T2 may include an output gate pattern GE2, an output source pattern SE2, an output drain pattern DE2, and an output semiconductor pattern AL2.

The control gate pattern GE1 and the control source pattern SE1 may be electrically connected to the input terminal IN, and the carry signal $CR_{k-1}$ of the previous scan driving stage may be applied thereto. For example, a part of the control source pattern SE1 may form the input terminal IN, and the control gate pattern GE1 may be electrically connected to the control source pattern SE1 through a contact hole. The control source pattern SE1 may be disposed to overlap the control gate pattern GE1. The control source pattern SE1 may include one or more protrusions extending toward the outside. For example, the control source pattern SE1 may include protrusions extending in the first direction X. The control gate pattern GE1 and the control source pattern SE1 may be disposed in different layers, and each of them may have a laminate structure formed of a plurality of layers.

The control semiconductor pattern AL1 may be disposed to at least partially overlap the control gate pattern GE1. The control semiconductor pattern AL1 may include a semiconductor material. For example, the control semiconductor pattern AL1 may be an oxide semiconductor pattern including indium-gallium-zinc oxide (IGZO). The control semiconductor pattern AL1 may serve as a channel of the control transistor T1.

In an exemplary embodiment, a planar area where the control gate pattern GE1 overlaps the control semiconductor pattern AL1 may be smaller than a planar area occupied by the control gate pattern GE1. For example, the control gate pattern GE1 may completely cover the control semiconductor pattern AL1, and the planar area of the control semiconductor pattern AL1 may be smaller than the planar area of the control gate pattern GE1.

The control drain pattern DE1 may be disposed to at least partially overlap the control gate pattern GE1 and the control semiconductor pattern AL1, and may be disposed to be spaced apart from the control source pattern SE1. The control drain pattern DE1 may be disposed on the same layer as the control source pattern SE1. The control drain pattern DE1 may be insulated from the control gate pattern GE1. The control drain pattern DE1 may be electrically connected to an output gate pattern GE2 to be described later through a contact hole. The control drain pattern DE1 may be electrically connected to the control node QN shown in FIG. 6. The control drain pattern DE1 may be shaped to surround at least a part of the control source pattern SE1. The control drain pattern DE1 may include one or more protrusions extending toward the control source pattern SE1. For example, the control drain pattern DE1 may include protrusions extending in the first direction X.

The control gate pattern GE1, the control source pattern SE1, and the control drain pattern DE1, described above, may form a control terminal, an input terminal and an output terminal of the control transistor T1, respectively. That is, a channel may be formed in the control semiconductor pattern AL1 according to a signal applied to the control gate pattern GE1. The signal (e.g., a carry signal) provided to the control source pattern SE1 may be transmitted to the control drain pattern DE1 through the channel of the control semiconductor pattern AL1.

The output gate pattern GE2 may be electrically connected to the control drain pattern DE1. Further, the output gate pattern GE2 may be electrically connected to the first capacitor electrode CP1. That is, the first capacitor electrode CP1 may be charged with a drain voltage of the control drain pattern DE1. For example, the output gate pattern GE2 and the first capacitor electrode CP1 may be integrally formed without a physical boundary. The first capacitor electrode CP1 has a predetermined area, and may be disposed to overlap a second capacitor electrode CP2 to be described later. The output gate pattern GE2 may be disposed on the same layer as the control gate pattern GE1.

The output semiconductor pattern AL2 may be disposed to at least partially overlap the output gate pattern GE2. The output semiconductor pattern AL2 may include the same material as the control semiconductor pattern AL1. For example, the output semiconductor pattern AL2 may be an oxide semiconductor pattern including indium-gallium-zinc oxide (IGZO). The output semiconductor pattern AL2 may serve as a channel of the scan signal output transistor T2.

The output source pattern SE2 may be disposed to at least partially overlap the output gate pattern GE2. The output source pattern SE2 may be electrically connected to the clock terminal CK, and the first clock signal CKV may be applied thereto. The output source pattern SE2 may include one or more protrusions extending toward the outside. For example, the output source pattern SE2 may include protrusions extending in the second direction Y. The output source pattern SE2 may be disposed on a different layer from the output gate pattern GE2.

The output drain pattern DE2 may be disposed to at least partially overlap the output gate pattern GE2 and the output semiconductor pattern AL2, and may be disposed to be spaced apart from the output source pattern SE2. The output drain pattern DE2 may be disposed on the same layer as the output source pattern SE2. The output drain pattern DE2 may be electrically connected to the output terminal OUT. Further, the output drain pattern DE2 may be electrically connected to the second capacitor electrode CP2. That is, the second capacitor electrode CP2 may be charged with the gate voltage of the output terminal OUT and the scan line SLk. For example, the output drain pattern DE2 and the second capacitor electrode CP2 may be integrally formed without a physical boundary. The second capacitor electrode CP2 may be disposed to overlap the first capacitor electrode CP1, and may form the charge capacitor C1 of FIG. 6 or the like together with a dielectric layer interposed therebetween. The output drain pattern DE2 may be shaped to surround at least a part of the output source pattern SE2. The output drain pattern DE2 may include one or more protrusions extending toward the output source pattern SE2. For example, the output drain pattern DE2 may include protrusions extending in the second direction Y.

The output gate pattern GE2, the output source pattern SE2, and the output drain pattern DE2, described above, may form a control terminal, an input terminal and an output terminal of the scan signal output transistor T2, respectively. That is, a channel may be formed in the output semiconductor pattern AL2 according to a signal applied to the output gate pattern GE2. The signal (e.g., a clock signal)

provided to the output source pattern SE2 may be transmitted to the output drain pattern DE2 through the channel of the output semiconductor pattern AL2.

Figure 8:
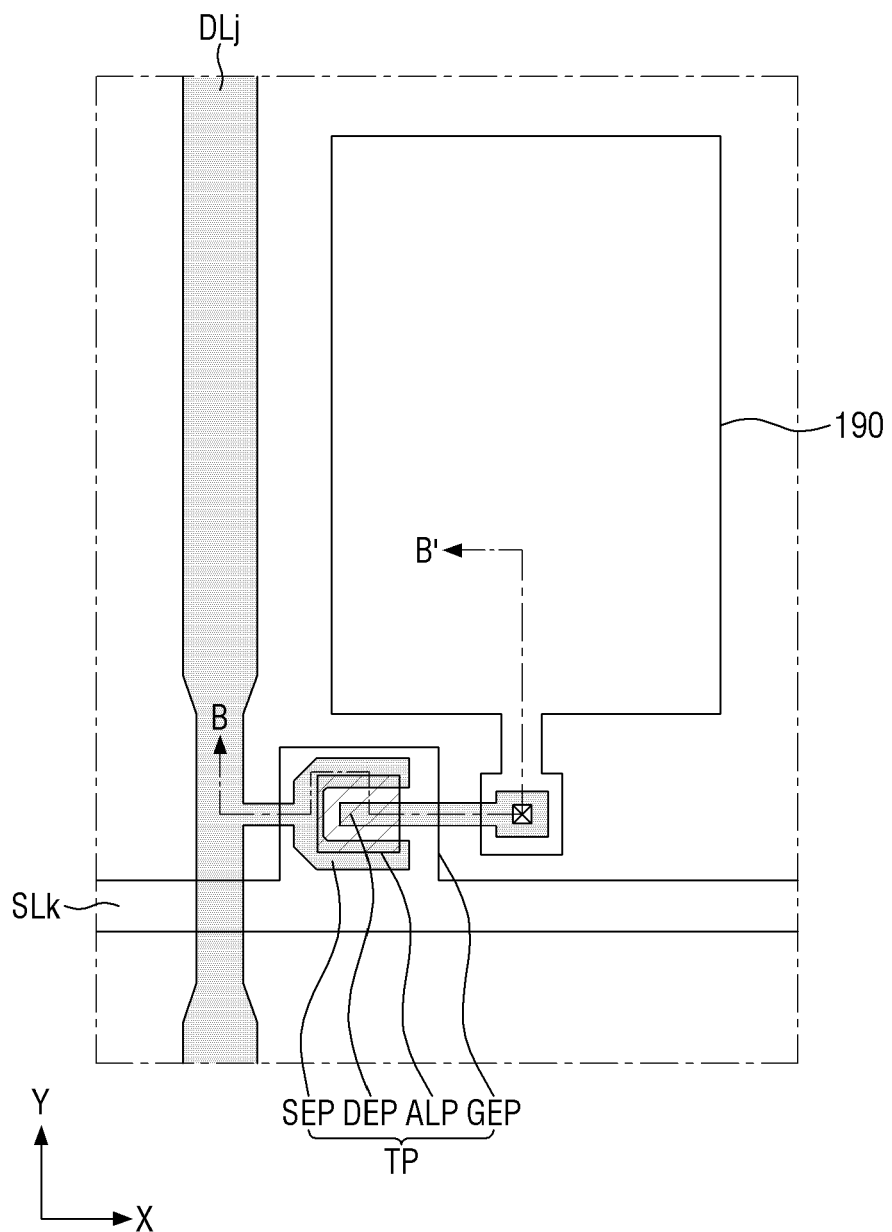
FIG. 8 is a layout view of any pixel of FIG. 2.

Hereinafter, the pixel PX will be described in more detail with reference to FIG. 8. FIG. 8 is a layout view of any pixel of FIG. 2.

Referring to FIG. 8, a pixel transistor TP (e.g., a second thin film transistor) and a pixel electrode 190 may be disposed in any pixel PX of the display area DA. The pixel transistor TP may include a pixel gate pattern GEP (e.g., a second gate pattern), a pixel source pattern SEP (e.g., a second source pattern), a pixel drain pattern DEP (e.g., a second drain pattern), and a pixel semiconductor pattern ALP (e.g., a second semiconductor pattern).

The pixel gate pattern GEP may be electrically connected to the scan line SLk, and the scan signal $S_k$ may be applied thereto. For example, a part of the scan line SLk may protrude to form the pixel gate pattern GEP. The control gate pattern GE1, the output gate pattern GE2, the scan wiring SLk, and the pixel gate pattern GEP, described above, may be disposed on the same layer, and may be simultaneously formed through one process.

The pixel semiconductor pattern ALP may be disposed to at least partially overlap the pixel gate pattern GEP. The pixel semiconductor pattern ALP may include the same material as the control semiconductor pattern AL1 and the output semiconductor pattern AL2. For example, the pixel semiconductor pattern ALP may be an oxide semiconductor pattern including indium-gallium-zinc oxide (IGZO) or the like. The control semiconductor pattern AL1, the output semiconductor pattern AL2, and the pixel semiconductor pattern ALP, described above, may be disposed on the same layer, and may be simultaneously formed through one process. The pixel semiconductor pattern ALP may serve as a channel of the pixel transistor TP.

The pixel source pattern SEP may be electrically connected to the data line DLj, and the data signal Dj may be applied thereto. For example, a part of the data line DLj may protrude to form the pixel source pattern SEP. The data line DLj may be insulated from the scan line SLk, and the pixel source pattern SEP may be insulated from the pixel gate pattern GEP. The pixel source pattern SEP may be disposed to at least partially overlap the pixel gate pattern GEP. The pixel source pattern SEP may be shaped to surround at least a part of the pixel drain pattern DEP.

The pixel drain pattern DEP may disposed to at least partially overlap the pixel gate pattern GEP and the pixel semiconductor pattern ALP, and may be disposed to be spaced apart from the pixel source pattern SEP. The pixel drain pattern DEP may be disposed on the same layer as the pixel source pattern SEP. The pixel drain pattern DEP may be electrically connected to the pixel electrode 190 through a contact hole. The control source pattern SE1, the control drain pattern DE1, the output source pattern SE2, the output drain pattern DE2, the data line DLj, the pixel source pattern SEP, and the pixel drain pattern DEP, described above, may be disposed on the same layer, and may be formed at the same time through one process.

The pixel gate pattern GEP, the pixel source pattern SEP and the pixel drain pattern DEP, described above, may form a control terminal, a input terminal and an output terminal of the pixel transistor TP, respectively. That is, a channel may be formed in the pixel semiconductor pattern ALP according to a signal applied to the pixel gate pattern GEP. The signal (e.g., data signal) provided to the pixel source pattern SEP may be transmitted to the pixel drain pattern DEP through the channel of the pixel semiconductor pattern ALP.

Figure 9:
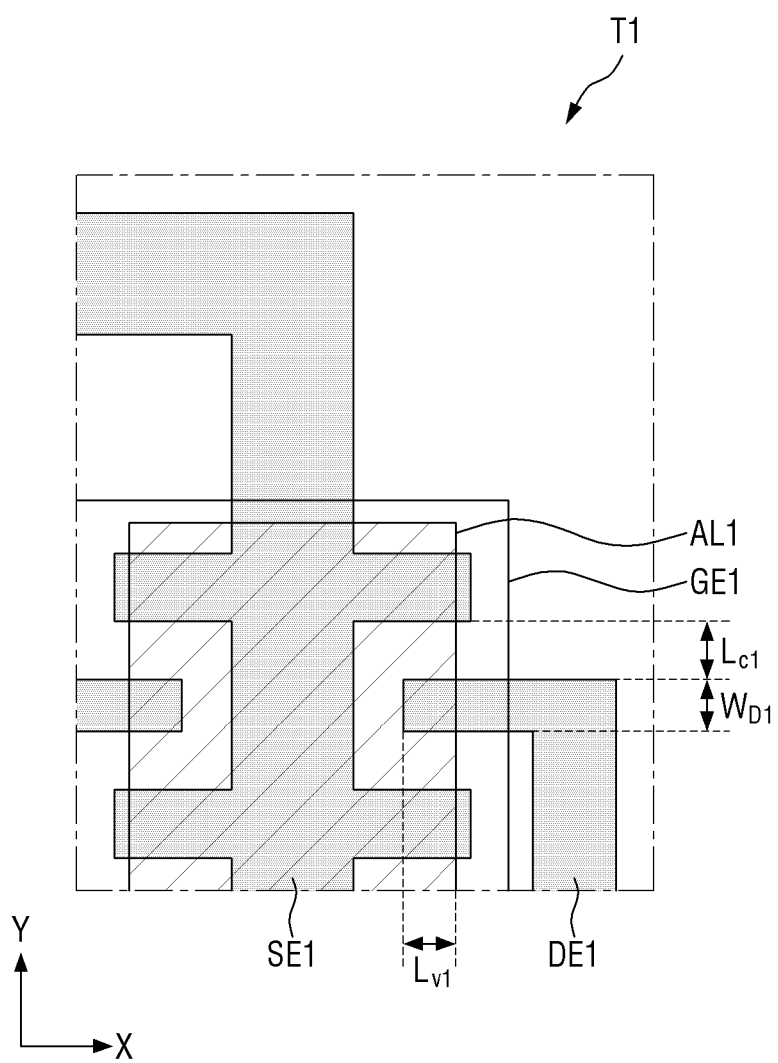
FIG. 9 is an enlarged view of the control transistor of FIG. 7.
Figure 10:
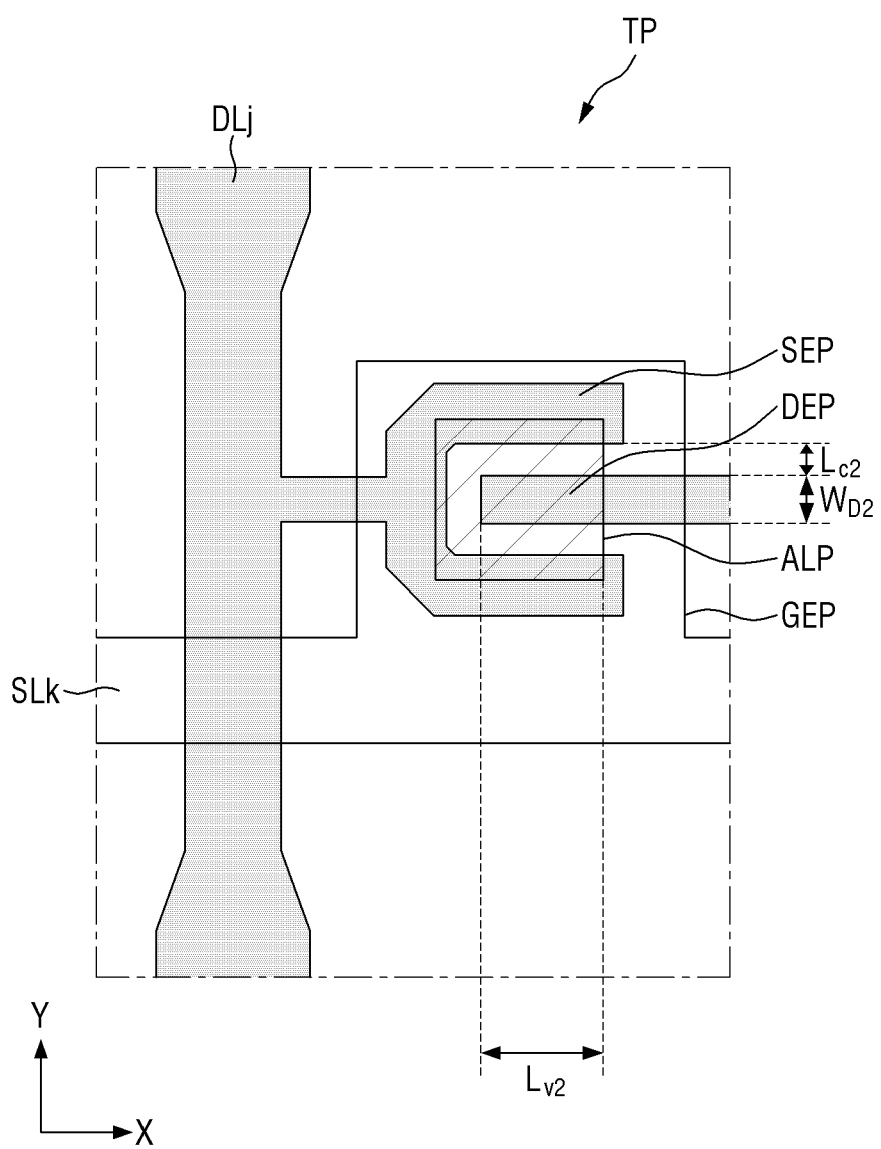
FIG. 10 is an enlarged view of the pixel transistor of FIG. 8.
Figure 11:
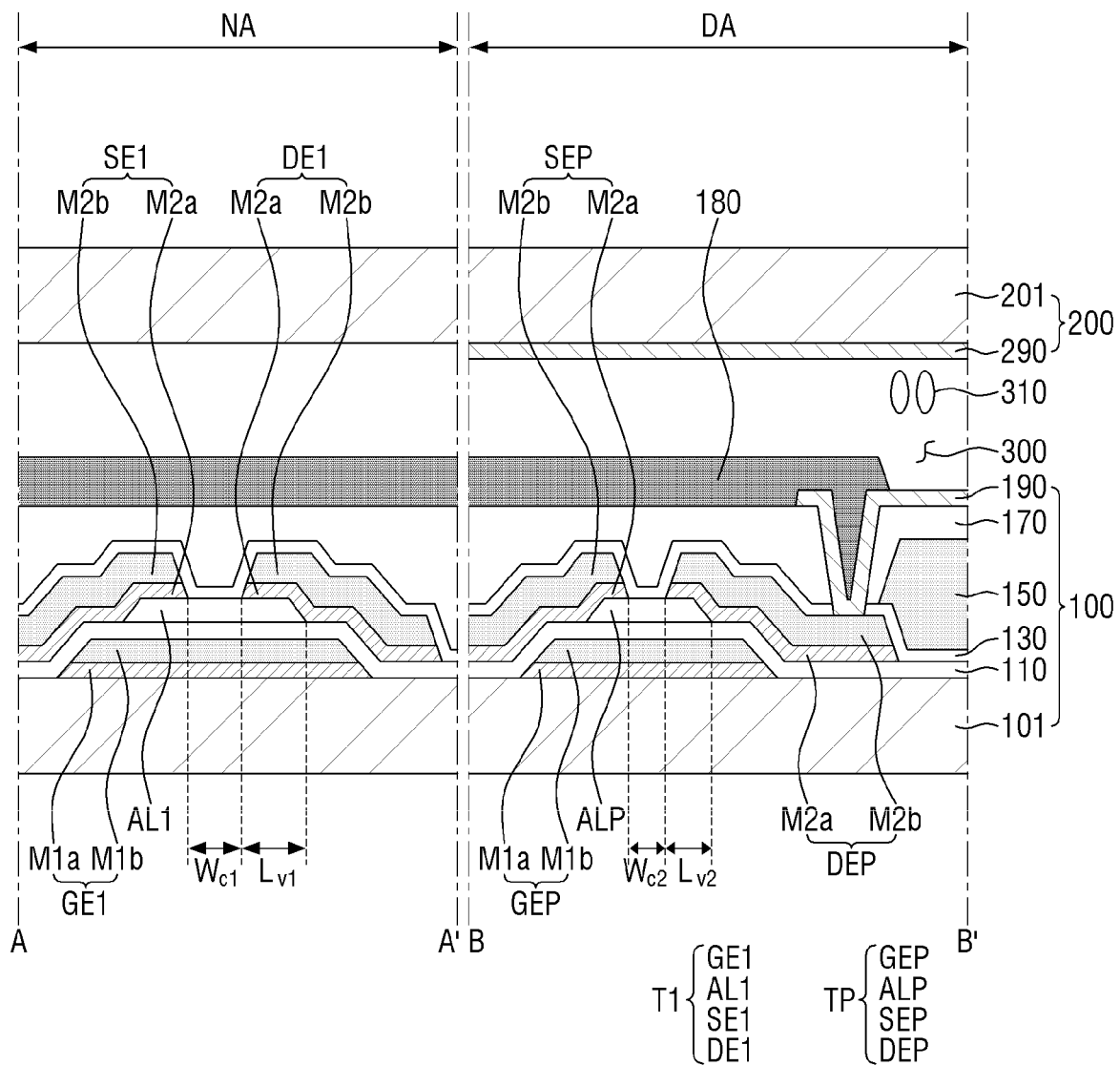
FIG. 11 is a comparative cross-sectional view of a cross-section taken along the line A-A' in FIG. 7 and a cross-section taken along the line B-B' in FIG. 8.

Hereinafter, the control transistor T1 and the pixel transistor TP according to an exemplary embodiment will be described in more detail with reference to FIGS. 9 to 11. FIG. 9 is an enlarged view of the control transistor T1 of FIG. 7. FIG. 10 is an enlarged view of the pixel transistor TP of FIG. 8. FIG. 11 is a comparative cross-sectional view of a cross-section taken along the line A-A' in FIG. 7 and a cross-section taken along the line B-B' in FIG. 8.

Referring to FIGS. 9 to 11, the wiring substrate 100 of the display device 1 according to an exemplary embodiment may include a first base substrate 101, a control transistor T1, a pixel transistor TP, and a pixel electrode 190.

The first base substrate 101 may be a transparent insulating plate or a transparent insulating film. For example, the first base substrate 101 may include a glass material, a quartz material, or a transparent plastic material. In an exemplary embodiment, the first base substrate 101 may be flexible, and the display device 1 may be a curved display device.

The pixel transistor TP may be disposed on the first base substrate 101 in the display area DA. The pixel transistor TP may be disposed for each pixel PX, and may transmit or block the data signal Dj to the pixel electrode 190 to be described later. As described above, the pixel transistor TP may include a pixel gate pattern GEP, a pixel semiconductor pattern ALP, a pixel source pattern SEP, and a pixel drain pattern DEP.

The pixel gate pattern GEP may have a laminate structure formed of a plurality of layers. For example, the pixel gate pattern GEP may include a first metal lower pattern layer M1$a$ and a first metal upper pattern layer M1$b$ disposed on the first metal lower pattern layer M1$a$. The first metal lower pattern layer M1$a$ may include a metal material having excellent adhesion to the first base substrate 101, and may be disposed directly on the first base substrate 101. The first metal lower pattern layer M1$a$ may include titanium or a titanium alloy. The titanium alloy may be an alloy of titanium and a refractory metal such as molybdenum (Mo), tantalum (Ta), chromium (Cr), nickel (Ni), or neodymium (Nd). The thickness of the first metal lower pattern layer M1$a$ may be about 100 Å to about 300 Å, but the inventive concepts are not limited thereto.

The first metal upper pattern layer M1$b$ may be disposed directly on the first metal lower pattern layer M1$a$. The first upper metal pattern layer M1$b$ may include a metal material having low specific resistance and excellent electrical conductivity as compared to the first lower metal pattern layer M1$a$. For example, the first upper metal pattern layer M1$b$ may include copper or a copper alloy. The thickness of the first metal upper pattern layer M1$b$ may be about 2,000 Å to about 5,000 Å, but the inventive concepts are not limited thereto.

A gate insulating layer 110 may be disposed on the pixel gate pattern GEP. The gate insulating layer 110 may be disposed over the display area DA and the non-display area NA. The gate insulating layer 110 may include an insulating material, and may have dielectric properties. The gate insulating layer 110 may be a single layer, or may have a laminate structure formed of a plurality of layers. The gate insulating layer 110 may include an inorganic insulating material such as silicon nitride ($SiN_x$), silicon oxide ($SiO_x$), or silicon oxynitride.

A pixel semiconductor pattern ALP may be disposed on the gate insulating layer 110. The pixel semiconductor pattern ALP may be disposed to overlap the pixel gate pattern GEP. In an exemplary embodiment, the pixel semiconductor pattern ALP may be an oxide semiconductor pattern including indium-gallium-zinc oxide (IGZO), or the like. The thickness of the pixel semiconductor pattern ALP may be about 400 Å to about 600 Å. When the pixel semiconductor pattern ALP is formed to have a thickness of 400 Å or more, it is possible to suppress the deterioration of the pixel semiconductor pattern ALP due to the vertical electric field formed from the pixel source pattern SEP and the pixel drain pattern DEP.

In an exemplary embodiment, a planar area where the pixel gate pattern GEP overlaps the pixel semiconductor pattern ALP may be smaller than a planar area occupied by the pixel gate pattern GEP. For example, the pixel gate pattern GEP may completely cover the pixel semiconductor pattern ALP, and the side surface of the pixel gate pattern GEP may further protrude compared to the side surface of the pixel semiconductor pattern ALP.

A pixel source pattern SEP and a pixel drain pattern DEP may be disposed on the pixel semiconductor pattern ALP. The pixel source pattern SEP and the pixel drain pattern DEP may be disposed to overlap the pixel semiconductor pattern ALP, and may be spaced apart from each other on the pixel semiconductor pattern ALP.

Each of the pixel source pattern SEP and the pixel drain pattern DEP may have a laminate structure formed of a plurality of layers. For example, each of the pixel source pattern SEP and the pixel drain pattern DEP may include a second metal lower pattern layer M2a and a second metal upper pattern layer M2b disposed on the second metal lower pattern layer M2a. The second metal lower pattern layer M2a may be in contact with the pixel semiconductor pattern ALP. The second metal lower pattern layer M2a can prevent metal ions in the second metal upper pattern layer M2b from diffusing into the pixel semiconductor pattern ALP. The second metal lower pattern layer M2a may include molybdenum or a molybdenum alloy. Molybdenum or molybdenum alloys have excellent stability against oxygen as compared to other metals, such as titanium. However, the inventive concepts are not limited thereto. In the case where the pixel semiconductor pattern ALP is an oxide semiconductor pattern, when titanium or the like is in contact with the pixel semiconductor pattern ALP, it is possible to reduce the electrical resistance of the pixel semiconductor pattern ALP by causing an oxygen vacancy of the pixel semiconductor pattern ALP. The pixel source pattern SEP and the pixel drain pattern DEP according to an exemplary embodiment are configured such that the second metal lower pattern layer M2a contacting the pixel semiconductor pattern ALP includes molybdenum or a molybdenum alloy, so as to suppress the oxygen vacancy of the pixel semiconductor pattern ALP. The thickness of the second metal lower pattern layer M2a may be about 300 Å to about 500 Å. When the thickness of the second metal lower pattern layer M2a is set to 500 Å or less, the drain current retention rate thereof can be improved.

The second upper metal pattern layer M2b may be disposed directly on the second lower metal pattern layer M2a. The second upper metal pattern layer M2b may include a metal material having relatively low specific resistance and excellent electrical conductivity as compared with the second metal lower pattern layer M2a. For example, the second upper metal pattern layer M2b may include copper or a copper alloy. The thickness of the second upper metal pattern layer M2b may be about 2,000 Å to about 7,000 Å, but the inventive concepts are not limited thereto.

A protective layer 130 may be disposed on the pixel source pattern SEP and the pixel drain pattern DEP. The protective layer 130 may be disposed over the display area DA and the non-display area NA. The protective layer 130 can prevent the pixel source pattern SEP and the pixel drain pattern DEP from contacting an organic material. The protective layer 130 may include an inorganic material, such as silicon nitride, silicon oxide, or silicon oxynitride.

A color conversion pattern 150 may be disposed on the protective layer 130. The color conversion pattern 150 may convert the color of transmitted light into a color different from that of incident light. For example, the color conversion pattern 150 may be a color filter including a colorant such as a pigment or dye dispersed in the pattern. As another example, the color conversion pattern 150 may be a wavelength shifter including quantum dots or the like dispersed in the pattern. In an exemplary embodiment, a red conversion filter may be disposed in the red pixel, a green conversion filter may be disposed in the green pixel, and a blue conversion filter may be disposed in the blue pixel. Thus, the respective pixels PX of the display device 1 may display different colors from each other.

A step compensation layer 170 may be disposed on the color conversion pattern 150. The step compensation layer 170 may at least partially compensate a step of a plurality of components disposed on the first base substrate 101 to provide a space in which the pixel electrode 190 and the like are stably disposed. The material of the step difference compensation layer 170 is not particularly limited as long as it can have insulating properties and planarization properties, but examples thereof may include organic materials, such as an acrylic resin, an epoxy resin, and a cardo resin.

A pixel electrode 190 may be disposed on the step compensation layer 170. The pixel electrode 190 may be an electric field generating electrode that generates an electric field in a liquid crystal layer 300 together with a common electrode 290 to be described later. The pixel electrodes 190 may be disposed for the respective pixels PX, and may be controlled independently of each other. The electric field formed by the pixel electrode 190 and the common electrode 290 may control the behavior of liquid crystals 310 located in the corresponding pixel PX and rearrange the liquid crystals 310. The pixel electrode 190 may be electrically connected to the pixel drain pattern DEP of the pixel transistor TP through a contact hole formed in the step compensation layer 170 and the protective layer 130. The pixel electrode 190 may include a transparent conductive material. Examples of the transparent conductive material include indium tin oxide (ITO), indium zinc oxide (IZO), zinc oxide (ZnO), indium (III) oxide ($In_2O_3$), indium gallium oxide (IGO), and aluminum zinc oxide (AZO).

In an exemplary embodiment, a light blocking pattern 180 may be disposed on the pixel electrode 190. The light blocking pattern 180 may absorb at least a part of light to block the transmission of light. For example, the light blocking pattern 180 may include a light blocking colorant such as a black pigment or a black dye. The light blocking pattern 180 may be disposed to overlap the pixel transistor TP.

Meanwhile, a control transistor T1 may be disposed on the first base substrate 101 in the non-display area NA. As described above, the control transistor T1 may form a part of the scan driver 600. In an exemplary embodiment, the control transistor T1 may overlap the light blocking pattern 180. The control transistor T1 may include a control gate pattern GE1, a control semiconductor pattern AL1, a control source pattern SE1, and a control drain pattern DE1.

The control gate pattern GE1 may include the same material as the pixel gate pattern GEP, and may have the same laminate structure. For example, the control gate pattern GE1 may include a first metal lower pattern layer M1a and a first metal upper pattern layer M1b. Since the first metal lower pattern layer M1a and the first metal upper pattern layer M1b have been described above, duplicate descriptions will be omitted.

The control semiconductor pattern AL1 may include the same material as the pixel semiconductor pattern ALP. For example, the control semiconductor pattern AL1 may be an oxide semiconductor pattern including indium-gallium-zinc oxide (IGZO), or the like. The thickness of the control semiconductor pattern AL1 may be about 400 Å to about 600 Å. The thickness of the control semiconductor pattern AL1 may be set to 400 Å or more to suppress the deterioration of the control semiconductor pattern AL1 due to the electric field in the vertical direction formed from the control source pattern SE1 and the control drain pattern DE1. A gate insulating layer 110 may be disposed between the control gate pattern GE1 and the control semiconductor pattern AL1.

In an exemplary embodiment, a planar area where the control gate pattern GE1 overlaps the control semiconductor pattern AL1 may be smaller than a planar area occupied by the control gate pattern GE1. For example, the control gate pattern GE1 may completely cover the control semiconductor pattern AL1, and the side surface of the control gate pattern GE1 may further protrude compared to the side surface of the control semiconductor pattern AL1.

A control source pattern SE1 and a control drain pattern DE1 may be disposed on the control semiconductor pattern AL1. The control source pattern SE1 and the control drain pattern DE1 may be disposed to overlap the control semiconductor pattern AL1, and may be spaced apart from each other on the control semiconductor pattern AL1.

The control source pattern SE1 and the control drain pattern DE1 may include the same material as the pixel source pattern SEP and the pixel drain pattern DEP, and may have the same laminate structure. For example, each of the control source pattern SE1 and the control drain pattern DE1 may include a second metal lower pattern layer M2a and a second metal upper pattern layer M2b. Since the second metal lower patterned layer M2a and the second metal upper patterned layer M2b have been described above, duplicate descriptions will be omitted.

Next, the counter substrate 200 will be described. The counter substrate 200 may include a second base substrate 201 and a common electrode 290. Like the first base substrate 101, the second base substrate 201 may be a transparent insulating plate or a transparent insulating film. The second base substrate 201 may be disposed to overlap the pixel transistor TP and the control transistor T1. A common electrode 290 may be disposed on the second base substrate 201. The common electrode 290 may form an electric field in the liquid crystal layer 300 together with the pixel electrode 190. The common electrode 290 may be disposed over the plurality of pixels PX without distinguishing the pixels PX, and a common voltage Vcom may be applied thereto. Like the pixel electrode 190, the common electrode 290 may include a transparent conductive material.

Next, the liquid crystal layer 300 will be described. The liquid crystal layer 300 may be disposed between the wiring substrate 100 and the counter substrate 200. The liquid crystal layer 300 may include a plurality of initially aligned liquid crystals 310. In this specification, the 'liquid crystals' refer to monomolecules having liquid crystal properties or aggregates thereof. In an exemplary embodiment, the liquid crystals have negative dielectric anisotropy, and their long axes may be aligned substantially perpendicular to the plane in the initial alignment state. The liquid crystal layer 300 may be disposed to overlap the pixel transistor TP, but may be disposed not to overlap the control transistor T1.

In an exemplary embodiment, the size of the control transistor T1 may be different from the size of the pixel transistor TP.

The length of the channel formed in the control semiconductor pattern AL1 of the control transistor T1, that is, the first channel length $L_{c1}$, may be greater than the length of the channel formed in the pixel semiconductor pattern ALP of the pixel transistor TP, that is, the second channel length $L_{c2}$. In this specification, the "channel length" refers to a distance between a source pattern and a drain pattern on a semiconductor pattern where a channel is formed along a flow direction of a current flowing through the channel. For example, each of the first channel length $L_{c1}$ and the second channel length $L_{c2}$ may be a length measured along the second direction Y. In an exemplary embodiment in which the control semiconductor pattern AL1 and the pixel semiconductor pattern ALP are oxide semiconductors, respectively, there is a problem in that the control semiconductor pattern AL1 and the pixel semiconductor pattern ALP are vulnerable to source-drain voltage stress. In particular, the deterioration of the semiconductor pattern due to the source-drain voltage stress may be further exacerbated in the control transistor T1 to which a higher voltage than the pixel transistor TP is applied. In the wiring substrate 100 of the display device 1 according to an exemplary embodiment, the first channel length $L_{c1}$ of the control transistor T1 is made greater than the second channel length $L_{c2}$ of the pixel transistor TP to minimize the deterioration occurring in the control transistor T1.

The first channel length $L_{c1}$ may be about 5.5 μm or more. When the first channel length $L_{c1}$ may be about 5.5 μm or more, it is possible to prevent the deterioration of the control semiconductor pattern AL1 due to the electron trap in the vicinity of the control drain pattern DE1 due to the horizontal electric field formed between the control source pattern SE1 and the control drain pattern DE1 and to improve the drain current retention rate of the control transistor T1. For example, the drain current retention rate of the control transistor T1 according to an exemplary embodiment may be about 95.0% or more, or about 95.5% or more, or about 96.0% or more.

Meanwhile, the length to which the control gate pattern GE1, the control semiconductor pattern AL1, and the control drain pattern DE1 overlap one other, that is, the first overlap length $L_{v1}$, may be greater than the length to which the pixel gate pattern GEP, the pixel semiconductor pattern ALP, and pixel drain pattern DEP overlap one another, that is, the second overlap length $L_2$. In this specification, the "overlap length of drain pattern" refers to a length to which a drain pattern simultaneously overlaps a semiconductor pattern and a gate pattern, and a length which is measured along a current direction flowing through the drain pattern. Further, in an exemplary embodiment in which a gate pattern is larger than a semiconductor pattern, the "overlap length of drain pattern" may refer to an overlap length of a drain pattern and a semiconductor pattern. For example, each of the first overlap length $L_{v1}$ and the second overlap length $L_{v2}$ may be a length measured along the first direction X.

In the wiring substrate 100 of the display device 1 according to an exemplary embodiment, the first overlap length $L_{v1}$ of the control transistor T1 is made greater than the second overlap length $L_{v2}$ of the pixel transistor TP to minimize the deterioration occurring in the control transistor T1.

The first overlap length $L_{v1}$ may be shorter than the first channel length $L_{c1}$. In some embodiments, the first overlap length $L_{v1}$ may be about 4.5 µm or more. When the first overlap length $L_{v1}$ is 4.5 m or more, it is possible to prevent the deterioration of the control semiconductor pattern AL1 due to the electron trap in the vicinity of the control drain pattern DE1 and to improve the drain current retention rate of the control transistor T1.

Further, the width of the channel formed in the control semiconductor pattern AL1 of the control transistor T1, that is, the first channel width $W_{c1}$, may be greater than the width of the channel formed in the pixel semiconductor pattern ALP of the pixel transistor TP, that is, the second channel width $W_{c2}$. In this specification, the "channel width" refers to a width of a channel through which a current flows between a source pattern and a drain pattern. For example, in an exemplary embodiment in which the control source pattern SE1 is shaped to partially surround the control drain pattern DE1, the first channel width $W_{c1}$ may refer to a length of the sum of two times the first overlap length $L_{v1}$ and the width $W_{D1}$ of the control drain pattern DE1. Further, in an exemplary embodiment in which the pixel source pattern SEP is shaped to partially surround the pixel drain pattern DEP, the second channel width $W_{c2}$ may refer to a length of the sum of two times the second overlap length $L_{v2}$ and the width $W_{D2}$ of the pixel drain pattern DEP. In the wiring substrate 100 of the display device 1 according to an exemplary embodiment, the first channel width $W_{c1}$ of the control transistor T1 is made greater than the second channel width $W_{c2}$ of the pixel transistor TP to minimize the deterioration occurring in the control transistor T1.

The first channel width $W_{c1}$ may be greater than the first overlap length $L_{v1}$. Further, the first channel width $W_{c1}$ may be greater than the first channel length $L_{c1}$. For example, the first channel width $W_{c1}$ may be less than three times the first overlap length $L_{v1}$. Specifically, the first channel width $W_{c1}$ may be less than two times the first channel length $L_{c1}$. In an exemplary embodiment, the first channel width $W_{c1}$ may be about 10 µm or more. When the first channel width $W_{c1}$ is 10 µm or more, it is possible to prevent the deterioration of the control semiconductor pattern AL1 due to the electron trap in the vicinity of the control drain pattern DE1 and to improve the drain current retention rate of the control transistor T1.

Hereinafter, a wiring substrate and a display device according to another exemplary embodiment of the present invention will be described. However, a description of the same configuration as the wiring substrate 100 and the display device 1 according to the aforementioned exemplary embodiment will be omitted, and this will be clearly understood by those skilled in the art from the attached drawings.

Figure 12:
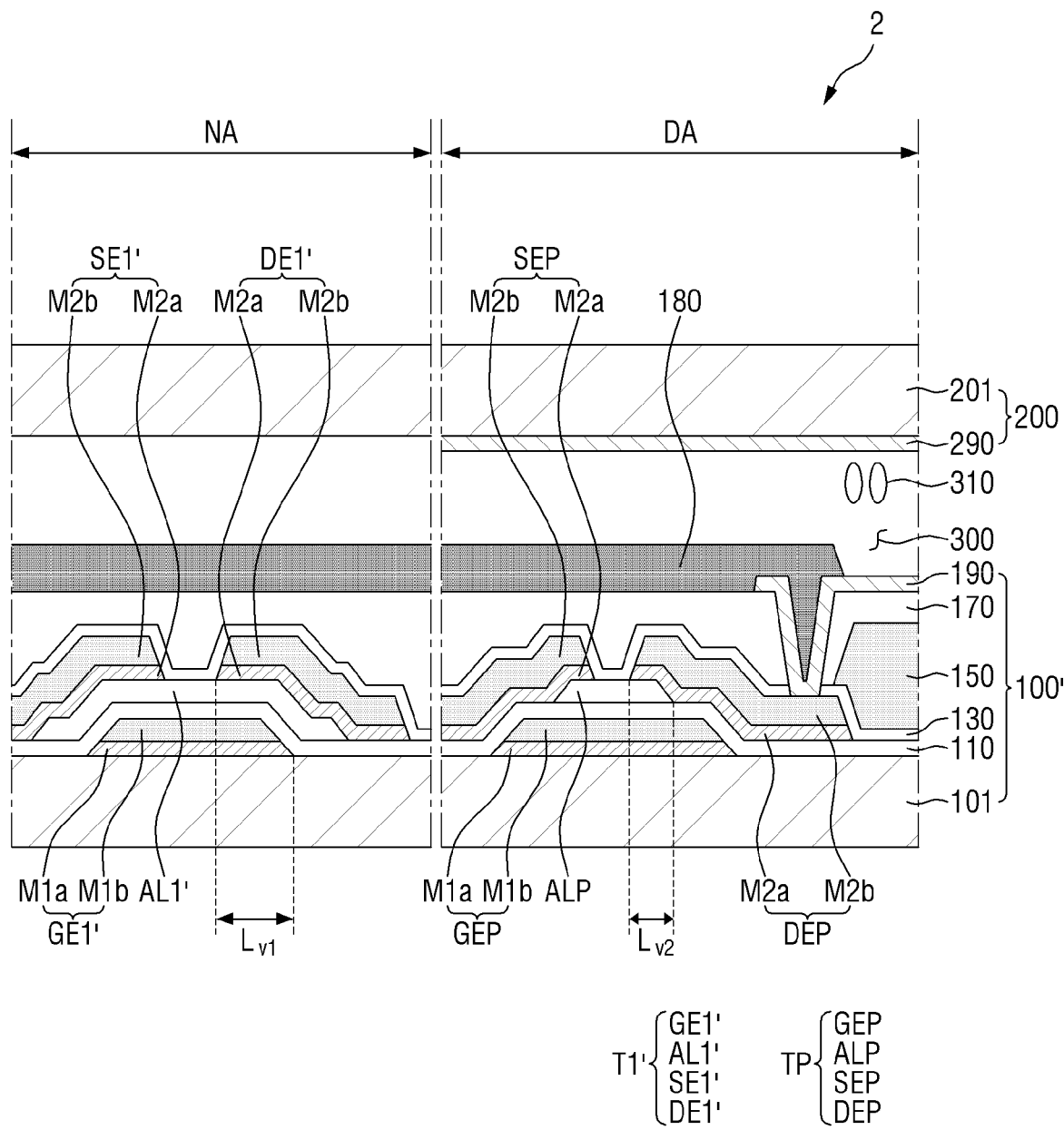
FIG. 12 is a comparative cross-sectional view of a control transistor and a pixel transistor of a display device according to another exemplary embodiment of the present invention.

FIG. 12 is a comparative cross-sectional view of a control transistor T1' and a pixel transistor of TP a display device 2 according to another exemplary embodiment of the present invention.

Referring to FIG. 12, a wiring substrate 100' and a display device 2 according to an exemplary embodiment are different from the wiring substrate 100 and the display device 1 according to the embodiment of FIG. 1 and the like in that a planar area where a control gate pattern GE1' and a control semiconductor pattern AL1' of a control transistor T1' of the wiring substrate 100' of the display device 2 overlap each other may be smaller than a planar area occupied by the control semiconductor pattern AL1'.

In an exemplary embodiment, the control semiconductor pattern AL1' may completely cover the control gate pattern GE1'. For example, the control semiconductor pattern AL1' may cover at least a part of the side surface of the control gate pattern GE1'.

Further, the length to which the control gate pattern GE1', the control semiconductor pattern AL1', and the control drain pattern DE1' overlap one other, that is, the first overlap length $L_{v1}$, may be greater than the length to which the pixel gate pattern GEP, the pixel semiconductor pattern ALP, and pixel drain pattern DEP overlap one another, that is, the second overlap length $L_{v2}$. In an exemplary embodiment in which a gate pattern is smaller than a semiconductor pattern, the "overlap length of drain pattern" may refer to an overlap length of a drain pattern and a gate pattern.

The control transistor T1' of the display device 2 according to an exemplary embodiment is configured to allow the control semiconductor pattern AL1' to have a relatively large area, so that the overlap length between the control drain pattern DE1' and the control semiconductor pattern AL1' can be secured, and the influence of a vertical electric field formed from the control drain pattern DE1' toward the control semiconductor pattern AL1' on the control semiconductor pattern AL1' can be further minimized.

Because other configurations of the display device 2, the first channel length and first channel width of the control transistor T1', and the pixel transistor TP have been described above, duplicate descriptions will be omitted.

Hereinafter, the present invention will be described in more detail with reference to Preparation Examples and Experimental Examples.

Preparation Example 1

As shown in FIG. 9, a thin film transistor including a gate pattern, a semiconductor pattern, a source pattern, and a drain pattern was prepared. The gate pattern had a double-layered structure of a titanium pattern layer and a copper pattern layer, and the copper pattern layer had a thickness of about 2,000 Å. The semiconductor pattern included indium-gallium-zinc oxide (IGZO). The semiconductor pattern had a thickness of about 500 Å. Each of the source pattern and the drain pattern had a double-layered structure of a molybdenum pattern layer and a copper pattern layer, and the molybdenum pattern layer had a thickness of about 500 Å.

The distance (that is, channel length) between the source pattern and the drain pattern, measured along the direction of current flow, was 5.5 µm. The overlap length (that is, overlap length of drain pattern) of the drain pattern, the semiconductor pattern, and the gate pattern, measured along the direction of current flow, was 4.5 µm. The width of a channel, measured along a direction perpendicular to the direction of current flow, was 10 µm.

Preparation Example 2

A thin film transistor was prepared in the same manner as in Preparation Example 1, except that the channel length was changed to 4.5 µm.

Comparative Example 1

A thin film transistor was prepared in the same manner as in Preparation Example 2, except that the overlap length of the drain pattern was changed to 3 µm.

Comparative Example 2

A thin film transistor was prepared in the same manner as in Preparation Example 2, except that the overlap length of the drain pattern was changed to 2 µm.

Comparative Example 3

A thin film transistor was prepared in the same manner as in Preparation Example 2, except that the channel width was changed to 4 μm.

Comparative Example 4

A thin film transistor was prepared in the same manner as in Preparation Example 2, except that the channel width was changed to 2 μm.

Experimental Example 1

Figure 13:
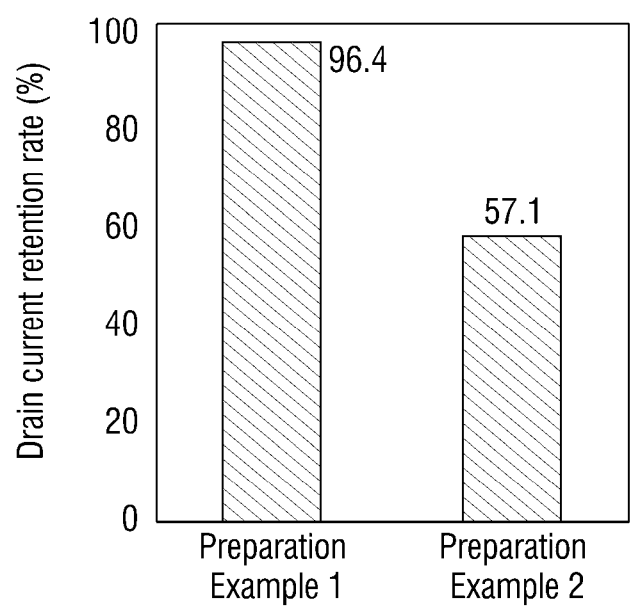
FIG. 13 is a graph showing a result according to Experimental Example 1.
Figure 16:
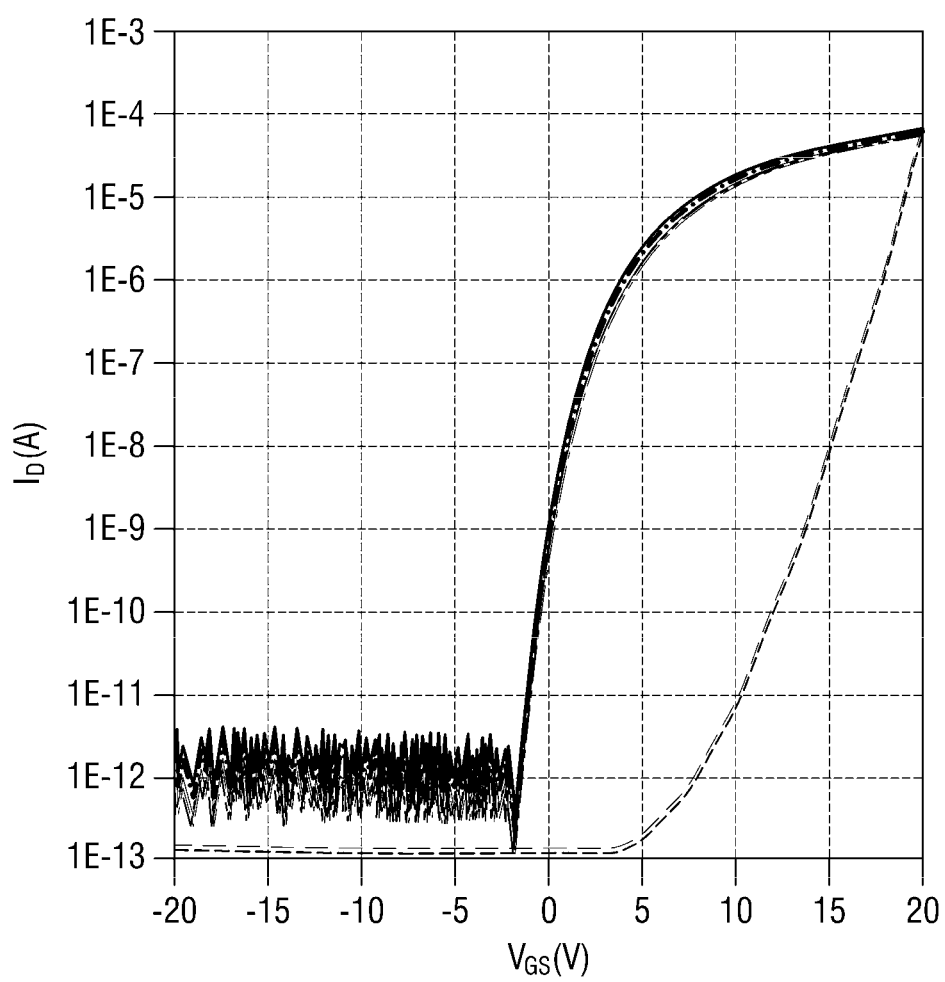
FIG. 16 is graph showing the characteristics of a drain current (ID) vs. a gate-source voltage (VGS) of the thin film transistor of Preparation Example 1.
Figure 17:
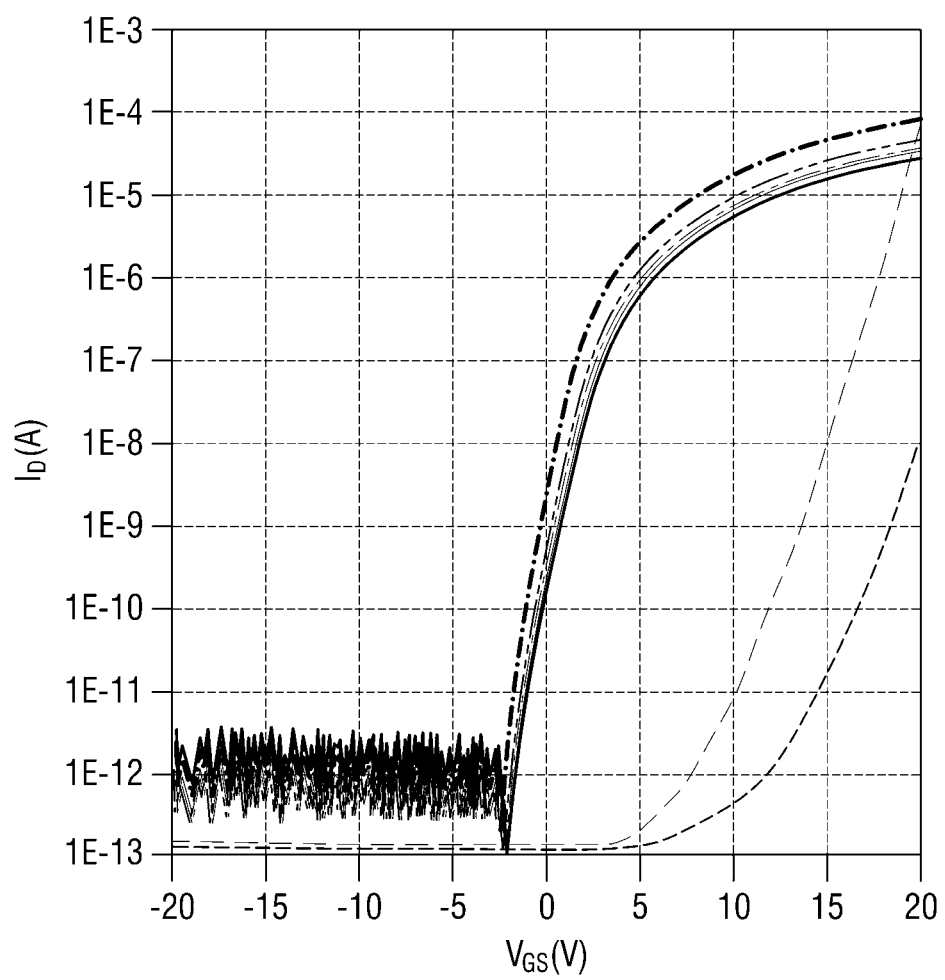
FIG. 17 is graph showing the characteristics of a drain current (ID) vs. a gate-source voltage (VGS) of the thin film transistor of Preparation Example 2.

The drain current retention rates of the thin film transistors according to Preparation Example 1 and Preparation Example 2 were measured, and the results thereof are shown in FIG. 13. Further, the drain current ($I_D$) characteristics of the thin film transistors according to Preparation Example 1 and Preparation Example 2 vs. the gate-source voltage ($V_{GS}$) are shown in FIGS. 16 and 17, respectively. The drain current retention rate of the thin film transistor according to Preparation Example 1 was about 96.4%, and the drain current retention rate of the thin film transistor according to Preparation Example 2 was about 57.1%.

After a voltage of 20 V was applied to the gate pattern of the thin film transistor and a voltage of 65 V was applied to the source pattern of the thin film transistor, an initial drain current ($I_{D0}$) was measured. Further, after the voltages were applied to the gate pattern and the source pattern for 1 hour, respectively, a drain current ($I_D$) was measured. The drain current retention rate may be expressed by the ratio ($I_D/I_{D0}$) of the drain current to the initial drain current.

Experimental Example 2

Figure 14:
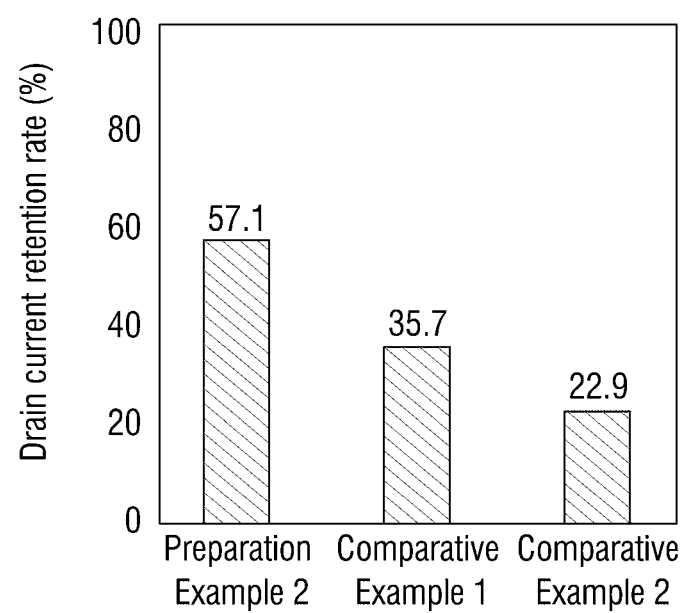
FIG. 14 is a graph showing a result according to Experimental Example 2.
Figure 18:
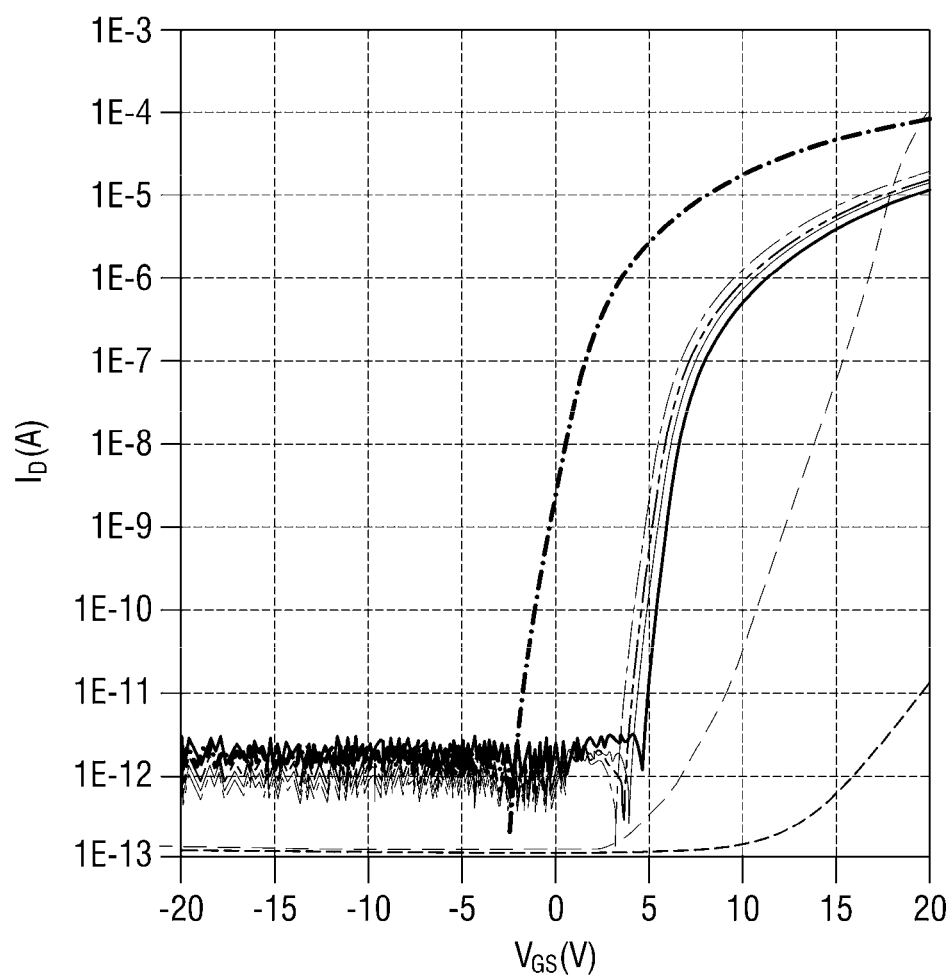
FIG. 18 is graph showing the characteristics of a drain current (ID) vs. a gate-source voltage (VGS) of the thin film transistor of Comparative Example 2.

The drain current retention rates of the thin film transistors according to Preparation Example 2, Comparative Example 1, and Comparative Example 2 were measured, and the results thereof are shown in FIG. 14. Further, the drain current ($I_D$) characteristics of the thin film transistor according to Comparative Example 2 vs. the gate-source voltage ($V_{GS}$) are shown in FIG. 18. The drain current retention rate of the thin film transistor according to Comparative Example 2 was about 22.9%.

Experimental Example 3

Figure 15:
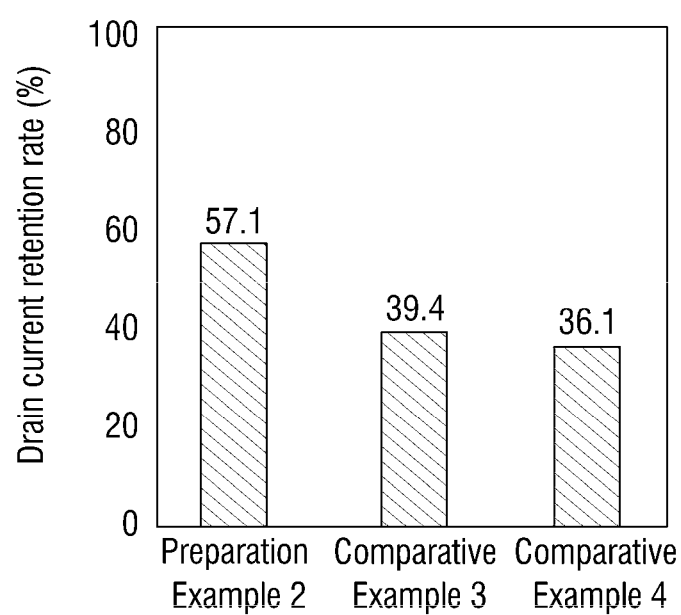
FIG. 15 is a graph showing a result according to Experimental Example 3.

The drain current retention rates of the thin film transistors according to Preparation Example 2, Comparative Example 3, and Comparative Example 4 were measured, and the results thereof are shown in FIG. 15.

First, referring to FIG. 13, it can be found that the thin film transistors according to Preparation Example 1 and Preparation Example 2 have relatively excellent drain current retention rates. Particularly, it can be found that the thin film transistor according to Preparation Example 1, in which the channel length is greater than the overlap length of the drain pattern and the channel width is less than two times the channel length, has a drain current retention rate is 96.4% or more.

Although the inventive concepts are not limited thereto, as the channel length increases, a lateral electric field formed between the source pattern and the drain pattern can be alleviated, and thus the deterioration of the contact surface between the drain pattern and the semiconductor pattern can be suppressed by accelerated carriers of the semiconductor pattern.

Next, referring to FIG. 14, it can be found that the thin film transistor according to Preparation Example 2 has a high drain current retention rate as compared with the thin film transistor according to Comparative Example 1 and Comparative Example 2. That is, it can be found that, even when the channel width is equal to the channel length, the thin film transistor according to Preparation Example 2, in which the channel width is less than three times the overlap length of the drain pattern, has a high drain current retention rate as compared with other thin film transistors.

Although the inventive concepts are not limited thereto, as the overlap length of the drain pattern increases, the influence of a vertical electric field formed from the drain pattern toward the semiconductor pattern on the unit area of a contact surface between the drain pattern and the semiconductor pattern can be minimized, and the trapping of electrons in the gate insulating layer 110 can be suppressed.

Next, referring to FIG. 15, it can be found that the thin film transistor according to Preparation Example 2 has a high drain current retention rate as compared with the thin film transistor according to Comparative Example 3 and Comparative Example 4. That is, it can be found that, even when the channel length is equal to the overlap length of the drain pattern, the thin film transistor according to Preparation Example 2, in which the channel width is greater than the channel length and the overlap length of the drain pattern, has a high drain current retention rate as compared with other thin film transistors.

As described above, according to exemplary embodiments of the present invention, it is possible to provide a wiring substrate and a display device, each including a thin film transistor invulnerable to source-drain voltage stress.

Although certain exemplary embodiments have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device, in which a display area and a non-display area are defined, the display device comprising a wiring substrate, the wiring substrate comprising:
    a base substrate;
    a first thin film transistor disposed on the base substrate, located in the non-display area, and comprising a first gate pattern, a first semiconductor pattern disposed on the first gate pattern, a first source pattern disposed on the first semiconductor pattern, and a first drain pattern disposed on the first semiconductor pattern and spaced apart from the first source pattern; and
    a second thin film transistor disposed on the base substrate and located in the display area, the second thin film transistor including a second gate pattern, a second semiconductor pattern disposed on the second gate pattern, a second source pattern disposed on the second semiconductor pattern, and a second drain pattern disposed on the second semiconductor pattern and spaced apart from the second source pattern,
    wherein a first channel width of the first thin film transistor is greater than a first overlap length of the first gate pattern, the first semiconductor pattern, and the first drain pattern and the first overlap length is greater than a second overlap length of the second gate pattern, the second semiconductor pattern, and the second drain pattern.

2. The display device of claim 1, wherein a first channel length of the first thin film transistor is greater than the first overlap length, and is less than the first channel width.

3. The display device of claim 2, wherein the first channel width is less than three times the first overlap length.

4. The display device of claim 3, wherein the first channel width is less than two times the first channel length.

5. The display device of claim 1, wherein the first overlap length is 4.5 μm or more.

6. The display device of claim 5, wherein the first channel length of the first thin film transistor is 5.5 μm or more.

7. The display device of claim 6, wherein the first channel width of the first thin film transistor is 10 μm or more.

8. The display device of claim 1, wherein the first overlap length is a length in a first direction, and the first channel length of the first thin film transistor is a length in a second direction perpendicular to the first direction.

9. The display device of claim 1, wherein the first semiconductor pattern comprises an oxide semiconductor.

10. The display device of claim 9, wherein:
the first semiconductor pattern comprises an indium-gallium-zinc oxide (IGZO); and
the first drain pattern comprises:
a first pattern layer contacting the first semiconductor pattern and comprising molybdenum; and
a second pattern layer disposed on the first pattern layer and comprising copper.

11. The display device of claim 10, wherein the first semiconductor pattern has a thickness of 400 Å or more, and the first pattern layer has a thickness of 500 Å or less.

12. The display device of claim 11, wherein the first thin film transistor has a drain current retention rate of 96.0% or more.

13. The display device of claim 1, wherein:
the first channel width is greater than a second channel width of the second thin film transistor; and
the first channel length of the first thin film transistor is greater than a second channel length of the second thin film transistor.

14. The display device of claim 13, wherein the first gate pattern is electrically connected to the first source pattern, and the second gate pattern is insulated from the second source pattern.

15. The display device of claim 13, wherein:
the wiring substrate further comprises:
a scan driver including a plurality of scan driving stages including the first thin film transistor; and
a plurality of scan lines configured to transmit output signals of the scan driving stages to the second gate pattern; and
a carry signal of the k-1-th scan driving stage is applied to the first gate pattern and the first source pattern of the first thin film transistor of the k-th scan driving stage.

16. The display device of claim 15, wherein:
each of the scan driving stages further comprises a charge capacitor comprising a first capacitor electrode and a second capacitor electrode; and
the first capacitor electrode is charged with a drain voltage of the first drain pattern of the first thin film transistor, and the second capacitor electrode is charged with a gate voltage of the scan line.

17. The display device of claim 1, further comprising:
a liquid crystal layer not overlapping the first thin film transistor and overlapping the second thin film transistor; and
a counter substrate overlapping the first thin film transistor and the second thin film transistor.

18. A wiring substrate, comprising:
a base substrate;
a first thin film transistor disposed on the base substrate and comprising a first gate pattern, a first semiconductor pattern disposed on the first gate pattern, a first source pattern disposed on the first semiconductor pattern, and a first drain pattern disposed on the first semiconductor pattern and spaced apart from the first source pattern; and
a second thin film transistor disposed on the base substrate, the second thin film transistor including a second gate pattern, a second semiconductor pattern disposed on the second gate pattern, a second source pattern disposed on the second semiconductor pattern, and a second drain pattern disposed on the second semiconductor pattern and spaced apart from the second source pattern,
wherein a first channel width of the first thin film transistor is greater than a first overlap length of the first gate pattern, the first semiconductor pattern, and the first drain pattern, and the first overlap length is greater than a second overlap length of the second gate pattern, the second semiconductor pattern, and the second drain pattern.

* * * * *